(12) United States Patent
Kitahara et al.

(10) Patent No.: US 12,504,589 B2
(45) Date of Patent: Dec. 23, 2025

(54) SEMICONDUCTOR RELAY MODULE

(71) Applicant: Panasonic Intellectual Property Management Co., Ltd., Osaka (JP)

(72) Inventors: Daisuke Kitahara, Osaka (JP); Naoki Ushiyama, Mie (JP); Shinsuke Taka, Mie (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 501 days.

(21) Appl. No.: 18/001,861

(22) PCT Filed: Jul. 30, 2021

(86) PCT No.: PCT/JP2021/028262
§ 371 (c)(1),
(2) Date: Dec. 14, 2022

(87) PCT Pub. No.: WO2022/030375
PCT Pub. Date: Feb. 10, 2022

(65) Prior Publication Data
US 2023/0335666 A1    Oct. 19, 2023

(30) Foreign Application Priority Data

Aug. 5, 2020 (JP) ................................ 2020-133164
Jul. 21, 2021 (JP) ................................ 2021-120201

(51) Int. Cl.
*G02B 6/42* (2006.01)
*H10F 55/00* (2025.01)

(52) U.S. Cl.
CPC ............. *G02B 6/4201* (2013.01); *G02B 6/42* (2013.01); *G02B 6/4293* (2013.01); *H10F 55/00* (2025.01); *G02B 6/4256* (2013.01)

(58) Field of Classification Search
CPC ...... G02B 6/42; G02B 6/4201; G02B 6/4256; G02B 6/4293; H10F 55/00; H10F 55/25; H01L 25/167
See application file for complete search history.

(56) References Cited

U.S. PATENT DOCUMENTS 5,559,466 A    9/1996    Okumura et al.
6,172,552 B1   1/2001    Tamai et al.
(Continued)

FOREIGN PATENT DOCUMENTS

EP    637136 A1       2/1995
EP    2244396 A2 *   10/2010    ........... H10F 55/255
(Continued)

OTHER PUBLICATIONS

The EPC Office Action dated Jan. 8, 2024 for the related European Patent Application No. 21854522.6.
(Continued)

*Primary Examiner* — Daniel Petkovsek
(74) *Attorney, Agent, or Firm* — Rimon P.C.

(57) ABSTRACT

A semiconductor relay module includes: first and second semiconductor relays; and first to third input terminals and first and second output terminals that are exposed from a housing. The first semiconductor relay includes a first optocoupler and a first switch, and the second semiconductor relay includes a second optocoupler and a second switch. The first switch and the second switch are connected by an output connecting line, the third input terminal is connected to an input connecting line, and the input connecting line and the output connecting line are covered by the housing.

13 Claims, 16 Drawing Sheets

(56) References Cited

U.S. PATENT DOCUMENTS

| | | | |
|---|---|---|---|
| 8,729,740 B2 * | 5/2014 | Hoshino | H03K 17/6874 |
| | | | 307/115 |
| 8,847,244 B2 * | 9/2014 | Ito | H03K 17/785 |
| | | | 257/85 |
| 10,491,135 B1 * | 11/2019 | Chmielus | H02H 9/002 |
| 2007/0187629 A1 * | 8/2007 | Matsuyama | H10F 55/10 |
| | | | 257/E31.097 |

FOREIGN PATENT DOCUMENTS

| | | |
|---|---|---|
| JP | 62-289013 | 12/1987 |
| JP | 7-046109 | 2/1995 |
| JP | 11-122087 | 4/1999 |
| JP | 2002-185033 | 6/2002 |
| JP | 2005-065150 | 3/2005 |
| JP | 2020-184742 A | 11/2020 |
| WO | 2020/217723 A1 | 10/2020 |

OTHER PUBLICATIONS

International Search Report of PCT application No. PCT/JP2021/028262 dated Sep. 21, 2021.

\* cited by examiner

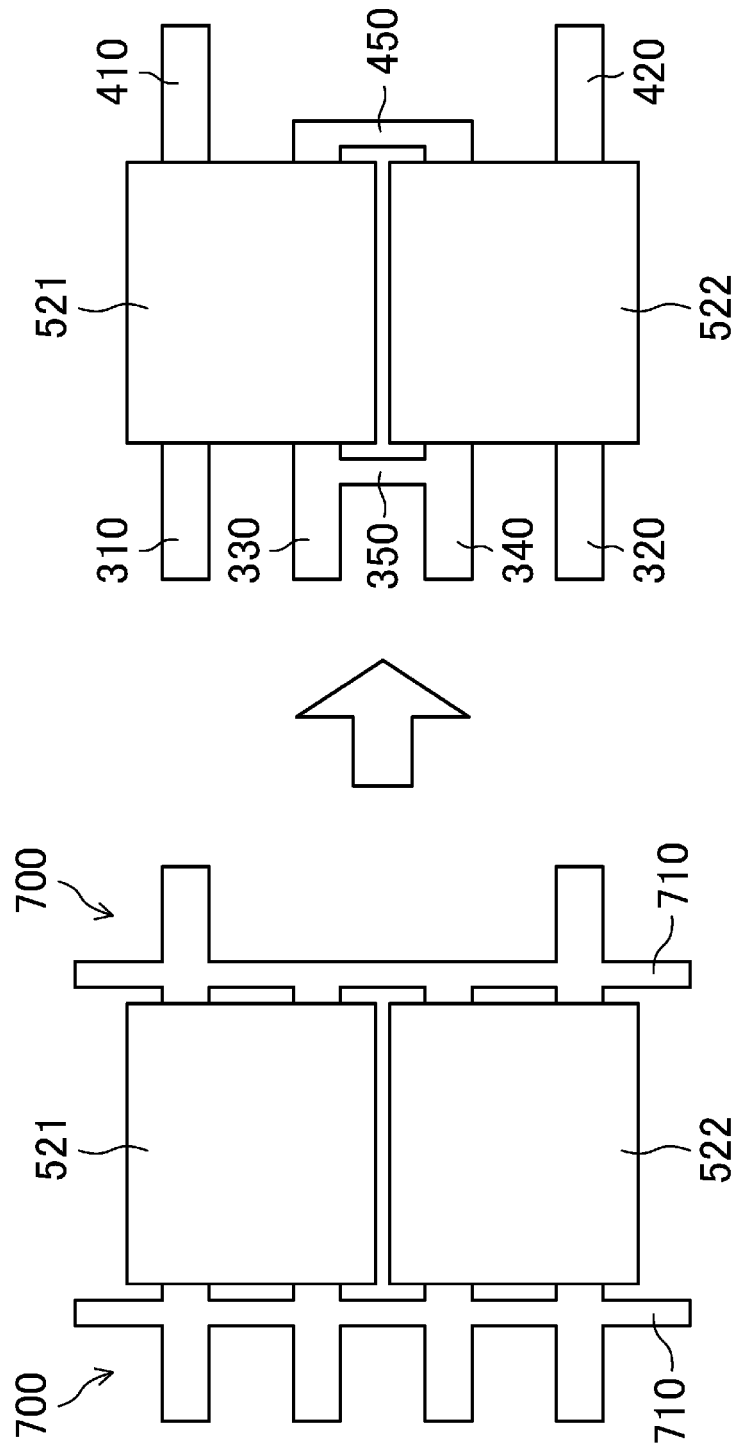

SEMICONDUCTOR RELAY MODULE

TECHNICAL FIELD

The present disclosure relates to semiconductor relay modules.

BACKGROUND ART

There is a conventionally known semiconductor relay that uses a photocoupler for an input unit, maintains electrical insulation between an input and an output, and switches the open/closed state between output terminals on the basis of an input signal that is input to an input terminal.

For example, Patent Literature (PTL) 1 discloses a semiconductor relay module in which two sets of output circuits each including a light-receiving device, a gate charging/discharging circuit, and a metal oxide semiconductor field effect transistor (hereinafter referred to as MOSFET) are provided for one light-emitting element.

PTL 2 discloses a semiconductor relay module in which two sets of semiconductor relays are integrated in one package. In each of the semiconductor relays, one light-emitting element, one light-receiving device, and one output circuit that are mentioned above are provided. Furthermore, the semiconductor module relay includes a pair of output terminals and a shared external input terminal drawn out from a connection point of the output circuits to the outside of the package.

CITATION LIST

Patent Literature

PTL 1: Unexamined Japanese Patent Publication No. H07-046109
PTL 2: Unexamined Japanese Patent Publication No. 2002-185033

SUMMARY OF THE INVENTION

However, with the conventional configuration disclosed in PTL 1, optical signals that are output from the light-emitting element are input to each of the two light-receiving devices and therefore, for example, individual inspection of each of the two sets of output circuits is difficult.

Meanwhile, with the configuration disclosed in PTL 2, such individual inspection is possible. However, since the shared external input terminal is provided between the pair of output terminals as a terminal for inspection, it is problematic in that the insulation distance between the output terminals cannot be secured. In this case, it is difficult to increase the withstand voltage between the output terminals when the semiconductor relay module is in the open state.

A semiconductor relay module according to the present disclosure includes: a first semiconductor relay; a second semiconductor relay; a housing covering the first semiconductor relay and the second semiconductor relay; a first input terminal exposed from the housing; a second input terminal exposed from the housing; a first output terminal exposed from the housing; a second output terminal exposed from the housing; a third input terminal exposed from the housing; an input connecting line covered by the housing; and an output connecting line covered by the housing. The first semiconductor relay includes: a first optocoupler including a first light-emitting element and a first light-receiving device configured to receive an optical signal from the first light-emitting element; and a first switch including a first metal oxide semiconductor field effect transistor (MOSFET) configured to connect and disconnect between a first output end of the first semiconductor relay and a second output end of the first semiconductor relay according to an output signal from the first light-receiving device. The second semiconductor relay includes: a second optocoupler including a second light-emitting element and a second light-receiving device configured to receive an optical signal from the second light-emitting element; and a second switch including a second MOSFET configured to connect and disconnect between a first output end of the second semiconductor relay and a second output end of the second semiconductor relay according to an output signal from the second light-receiving device. The first input terminal is connected to an anode of the first light-emitting element. The second input terminal is connected to a cathode of the second light-emitting element. A cathode of the first light-emitting element of the first semiconductor relay and an anode of the second light-emitting element of the second semiconductor relay are connected via the input connecting line. The first output terminal is connected to the first output end of the first semiconductor relay. The second output terminal is connected to the second output end of the second semiconductor relay. The second output end of the first semiconductor relay and the first output end of the second semiconductor relay are connected via the output connecting line. The third input terminal is connected to the input connecting line.

According to the present disclosure, each of the plurality of semiconductor relays can be independently inspected, and the withstand voltage between the output terminals can be increased.

BRIEF DESCRIPTION OF THE DRAWINGS

FIG. 4 is a diagram illustrating a part of processes of manufacturing a semiconductor relay module.

DESCRIPTION OF EMBODIMENTS

Hereinafter, exemplary embodiments of the present disclosure will be described in detail with reference to the drawings. The following description of preferred exemplary embodiments is essentially a mere example and is not at all intended to limit the present invention, the applicable range thereof, or the usage thereof.

Embodiment 1

[Configuration and Operation of Semiconductor Relay Module]

Figure 1A:
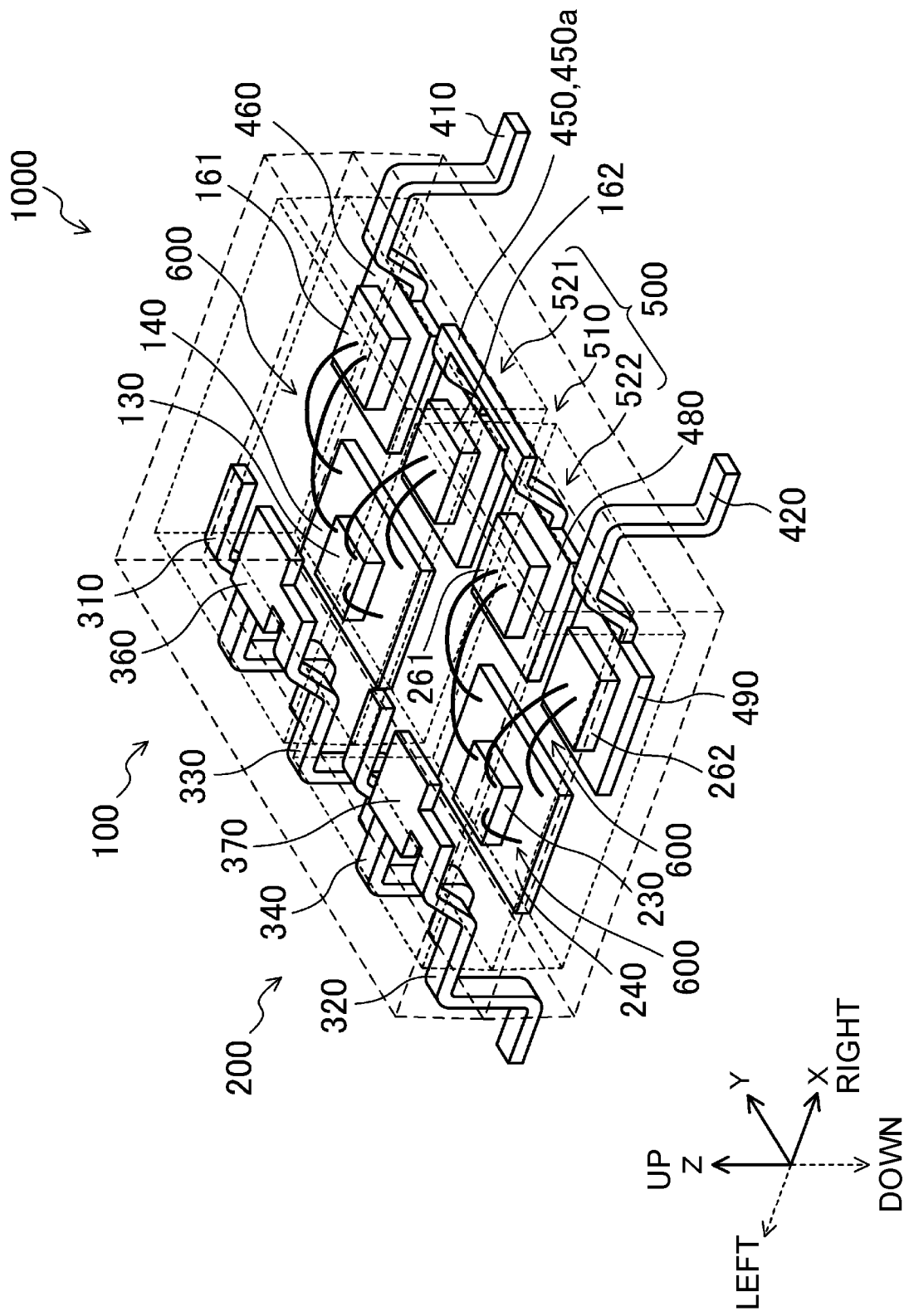
FIG. 1A is a perspective view of a semiconductor relay module according to Embodiment 1.
Figure 1B:
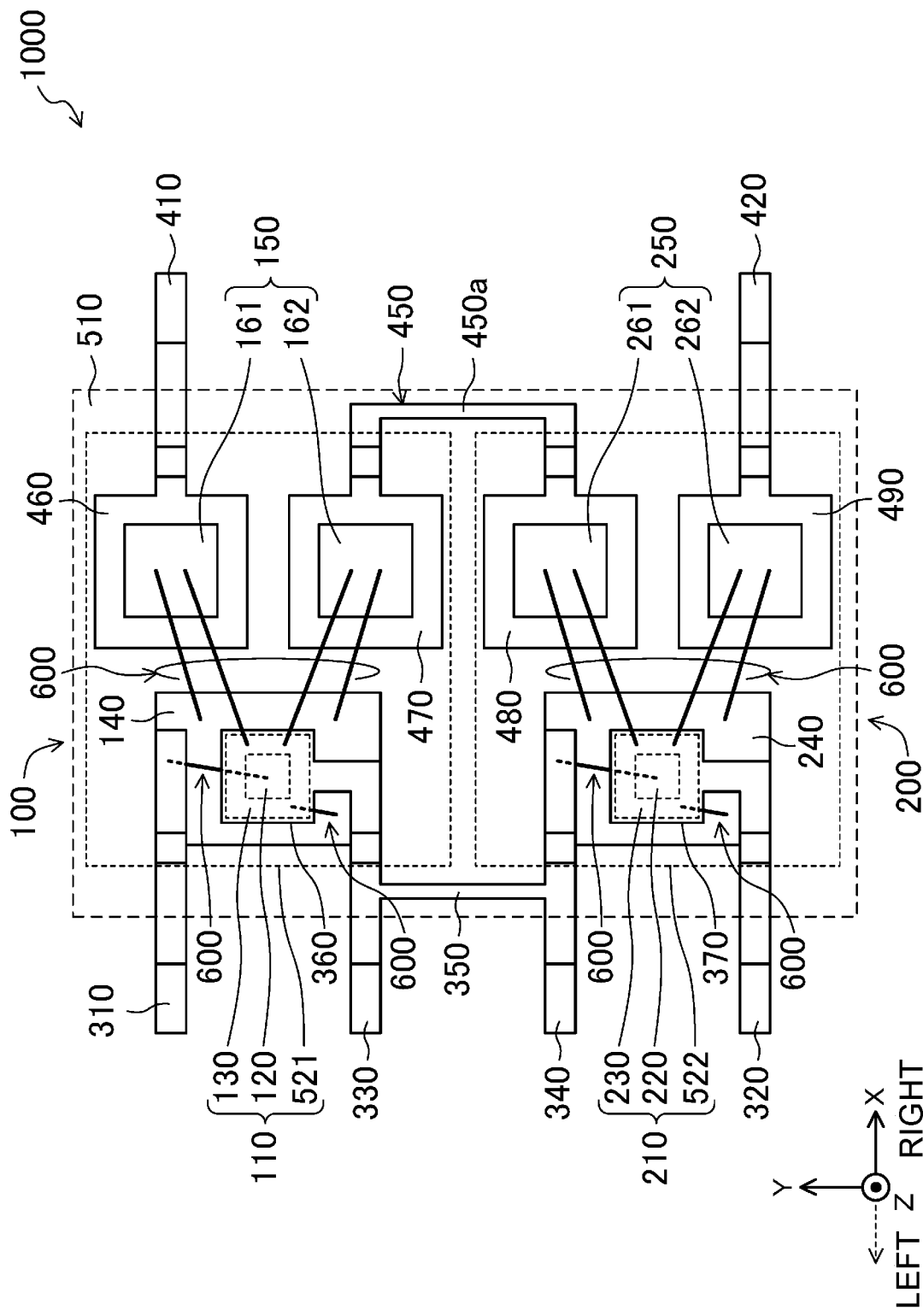
FIG. 1B is a plan view of a semiconductor relay module according to Embodiment 1.
Figure 1C:
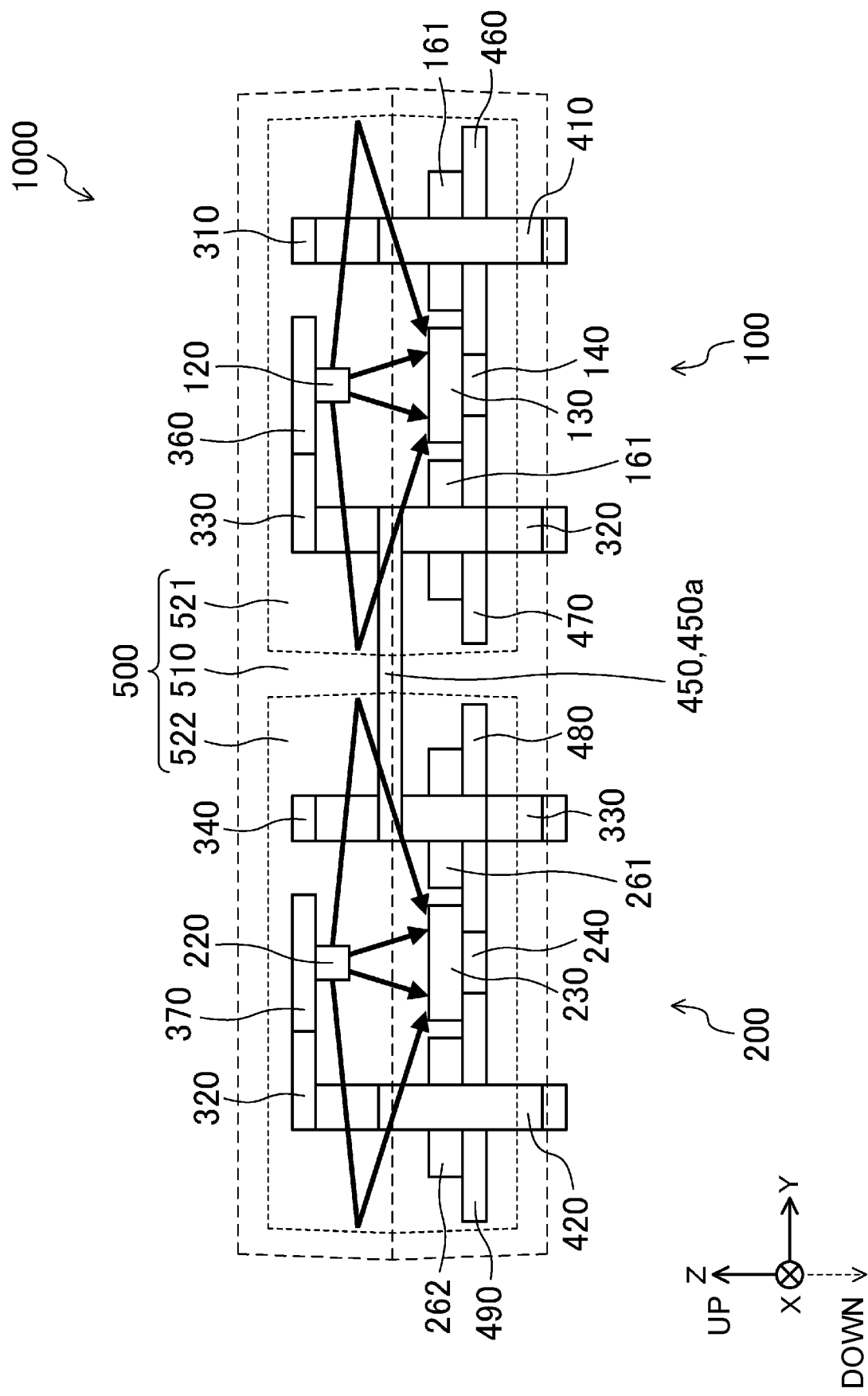
FIG. 1C is a side view of a semiconductor relay module according to Embodiment 1.
Figure 2:
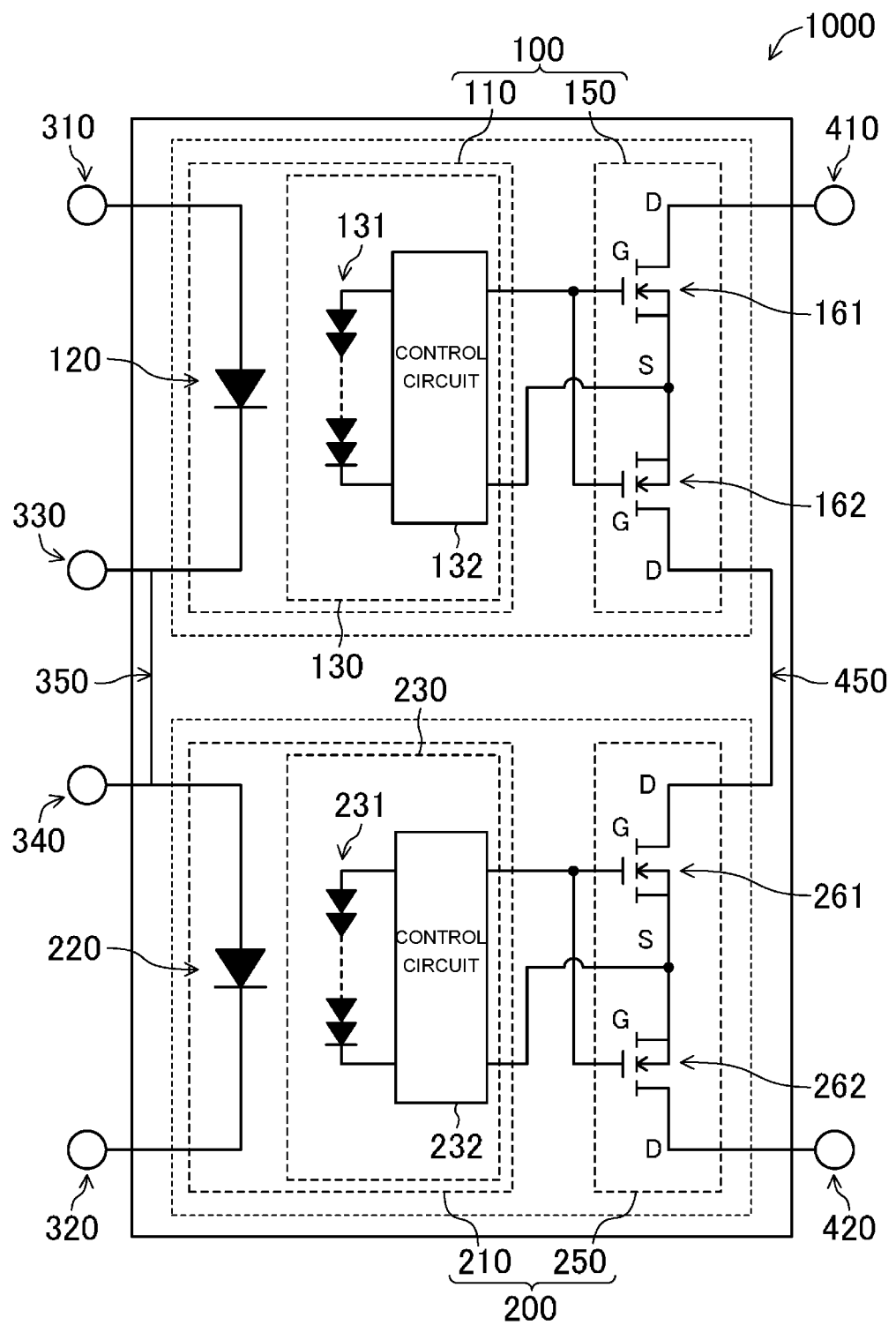
FIG. 2 is a circuit diagram of a semiconductor relay module according to Embodiment 1.

FIG. 1A illustrates a perspective view of semiconductor relay module 1000 according to Embodiment 1, FIG. 1B illustrates a plan view of semiconductor relay module 1000 according to Embodiment 1, and FIG. 1C illustrates a side view of semiconductor relay module 1000 according to Embodiment 1 as viewed from the output terminal side. FIG. 2 illustrates a circuit diagram of semiconductor relay module 1000. Note that in FIG. 1A to FIG. 1C, the contours of housing 500, first light transmissive part 521, and second light transmissive part 522 are indicated by dashed lines for convenience of description. In FIG. 1C, illustration of metal wire 600 is omitted.

In the following description, the direction of alignment of first to fourth input terminals 310, 320, 330, 340 may be referred to as a Y direction (the first direction), the direction of alignment of first optocoupler 110 and first switch 150 and the direction of alignment of second optocoupler 210 and second switch 250 may be referred to as an X direction (the second direction), and the direction intersecting both the Y direction and the X direction may be referred to as a Z direction (the third direction). In the X direction, the area in which first to fourth input terminals 310, 320, 330, 340 are arranged may be referred to as the left or the left side, and the area in which first output terminal 410 and second output terminal 420 are arranged may be referred to as the right or the right side. In the Z direction, the area in which first light emitting diode (LED) 120 and second LED 220 are arranged may be referred to as up or upper/upward, and the area in which first light-receiving device 130 and second light-receiving device 230 are arranged may be referred to as down or lower/downward.

As illustrated in FIG. 1A to FIG. 1C, semiconductor relay module 1000 includes first semiconductor relay 100, second semiconductor relay 200, housing 500, first to fourth input terminals 310, 320, 330, 340, first output terminal 410, and second output terminal 420.

As illustrated in FIG. 2, first semiconductor relay 100 includes first optocoupler 110 and first switch 150. As illustrated in FIG. 1B, first optocoupler 110 includes first light-emitting element 120, first light-receiving device 130, and first light transmissive part 521. Note that first light-emitting element 120 includes one or more light emitting diodes (hereinafter referred to as LEDs). In the following description, first light-emitting element 120 will be referred to as first LED 120.

In first optocoupler 110, first LED 120 has an anode connected to one end of metal wire 600 and a cathode connected to die pad 360 provided at an end portion of third input terminal 330 that is located inside housing 500 using an electrically conductive adhesive material such as silver paste not illustrated in the drawings. The other end of metal wire 600 is connected to first input terminal 310. For example, a gold wire is used as metal wire 600.

First light-receiving device 130 is configured by forming first light-receiving element 131 (refer to FIG. 2) and first control circuit 132 (refer to FIG. 2) on one semiconductor substrate (not illustrated in the drawings) or is configured by mounting these on one mounting substrate (not illustrated in the drawings). Note that first light-receiving element 131 is a photodiode array (hereinafter referred to as PDA). In the following description, first light-receiving element 131 will be referred to as first PDA 131.

First light-receiving device 130 is mounted on a surface of die pad 140 using an electrically conductive adhesive material such as silver paste. Furthermore, first control circuit 132 is electrically connected to die pad 140. The source of first light-receiving device 130 is connected to die pad 140 using metal wire 600.

First light transmissive part 521, which is made of an insulating light transmissive resin, is disposed so as to cover first LED 120, first light-receiving device 130, and the spacing between first LED 120 and first light-receiving device 130. First light transmissive part 521 is configured as an optical coupling space for first LED 120 and first light-receiving device 130. Note that first light transmissive part 521 is formed so as to also cover first switch 150.

First switch 150 includes MOSFET 161 and MOSFET 162, and each of MOSFET 161 and MOSFET 162 is a vertical N-channel MOSFET having a known configuration with a gate (G) electrode (refer to FIG. 2; hereinafter referred to simply as a gate (G)) and a source (S) electrode (refer to FIG. 2; hereinafter referred to simply as a source (S)) on a front surface and a drain (D) electrode (refer to FIG. 2; hereinafter referred to simply as a drain (D)) on a rear surface.

In first semiconductor relay 100, the sources (S) are electrically connected to each other, and MOSFET 161 and MOSFET 162 are connected in series, as illustrated in FIG. 1B and FIG. 2. The specific connection relationship will be further described.

The gate (G) of MOSFET 161 is connected to first control circuit 132 via metal wire 600. Similarly, the gate (G) of MOSFET 162 is connected to first control circuit 132 via metal wire 600. Meanwhile, the source (S) of MOSFET 161 and the source (S) of MOSFET 162 are connected via metal wires 600 to die pad 140 on which first light-receiving device 130 is mounted. This means that the source (S) of MOSFET 161 and the source (S) of MOSFET 162 are electrically connected to first control circuit 132 via metal wires 600 and die pad 140. Note that the drain (D) of MOSFET 161 is connected to a surface of die pad 460 using an electrically conductive adhesive material such as silver paste, and similarly the drain (D) of MOSFET 162 is connected to a surface of die pad 470.

Second semiconductor relay 200 includes second optocoupler 210 and second switch 250. Second optocoupler 210 includes second light-emitting element 220, second light-receiving device 230, and second light transmissive part 522. Note that second light-emitting element 220 includes one or more light emitting diodes (hereinafter referred to as LEDs). In the following description, second light-emitting element 220 will be referred to as second LED 220.

In second optocoupler 210, second LED 220 has an anode connected to one end of metal wire 600 and a cathode connected to die pad 370 provided at an end portion of second input terminal 320 that is located inside housing 500 using an electrically conductive adhesive material such as silver paste not illustrated in the drawings. The other end of metal wire 600 is connected to fourth input terminal 340.

Second light-receiving device 230 is configured by forming second light-receiving element 231 (refer to FIG. 2) and second control circuit 232 (refer to FIG. 2) on one semiconductor substrate (not illustrated in the drawings) or is configured by mounting these on one mounting substrate (not illustrated in the drawings). Note that second light-receiving element 231 is a PDA. In the following description, second light-receiving element 231 will be referred to as second PDA 231.

Second light-receiving device 230 is mounted on a surface of die pad 240 using an electrically conductive adhesive material such as silver paste. Furthermore, second control circuit 232 is electrically connected to die pad 240. The source of second light-receiving device 230 is connected to die pad 240 using metal wire 600.

Similar to first light transmissive part 521, second light transmissive part 522 is made of an insulating light transmissive resin and is disposed so as to cover second LED 220, second light-receiving device 230, and the spacing between second LED 220 and second light-receiving device 230. Second light transmissive part 522 is configured as an optical coupling space for second LED 220 and second light-receiving device 230. Note that second light transmissive part 522 is formed so as to also cover second switch 250. Furthermore, first light transmissive part 521 and second light transmissive part 522 are spaced a predetermined distance apart from each other in the Y direction.

Second switch 250 includes MOSFET 261 and MOSFET 262, and similar to MOSFET 161 and MOSFET 162, each of MOSFET 261 and MOSFET 262 is a vertical N-channel MOSFET having a known configuration.

In second semiconductor relay 200, MOSFET 261 and MOSFET 262 are connected in series as illustrated in FIG. 1B and FIG. 2, and the connection relationship thereof is substantially the same as the connection relationship of MOSFET 161 and MOSFET 162 in first semiconductor relay 100.

Specifically, the gate (G) of MOSFET 261 is connected to second control circuit 232 via metal wire 600. Similarly, the gate (G) of MOSFET 262 is connected to second control circuit 232 via metal wire 600. Meanwhile, the source (S) of MOSFET 262 and the source (S) of MOSFET 262 are connected via metal wires 600 to die pad 240 on which second light-receiving device 230 is mounted. This means that the source (S) of MOSFET 261 and the source (S) of MOSFET 262 are electrically connected to second control circuit 232 via metal wires 600 and die pad 240. Note that the drain (D) of MOSFET 261 is connected to a surface of die pad 480 using an electrically conductive adhesive material such as silver paste, and similarly the drain (D) of MOSFET 262 is connected to a surface of die pad 490.

As is clear from FIG. 2, MOSFET 161 of first switch 150 and MOSFET 261 of second switch 250 are arranged so that the directions of alignment of the sources (S) and the drains (D) are the same in the Y direction. MOSFET 162 of first switch 150 and MOSFET 262 of second switch 250 are arranged so that the directions of alignment of the sources (S) and the drains (D) are the same in the Y direction.

Housing 500 is an insulating resin structure including first light transmissive part 521 and second light transmissive part 522, which are mentioned above, and light blocker 510. Housing 500 covers first semiconductor relay 100, second semiconductor relay 200, a portion of each of first to fourth input terminals 310, 320, 330, 340, and a portion of each of first output terminal 410 and second output terminal 420.

Light blocker 510, which is made of an insulating light-blocking resin, is provided so as to cover first optocoupler 110 including first light transmissive part 521, first switch 150, second optocoupler 210 including second light transmissive part 522, and second switch 250. Light blocker 510 is disposed so as to fill the gap between first light transmissive part 521 and second light transmissive part 522.

By providing light blocker 510 between first light transmissive part 521 and second light transmissive part 522, it is possible to prevent optical signals of first LED 120 provided in first semiconductor relay 100 from entering second PDA 231 provided in second semiconductor relay 200, as illustrated in FIG. 1C. Similarly, it is possible to prevent optical signals of second LED 220 provided in second semiconductor relay 200 from entering first PDA 131 provided in first semiconductor relay 100. Furthermore, it is possible to prevent the optical signals of each of first LED 120 and second LED 220 from leaking to the outside of housing 500.

As illustrated in FIG. 1A, each of first to fourth input terminals 310, 320, 330, 340 is drawn out from a vertically middle portion of housing 500 to the outside of housing 500, is bent, extends downward along a side surface of housing 500, is further bent, and extends along the lower surface of housing 500, substantially parallel to said lower surface. Furthermore, each of first to fourth input terminals 310, 320, 330, 340 is bent inside housing 500, extends upward, is further bent, and extends substantially parallel to the upper surface of housing 500. Note that portions of second input terminal 320 and third input terminal 330 that extend substantially parallel to the upper surface of housing 500 are further bent in the Y direction. Die pad 360 and second die pad 370 are provided at end portions of second input terminal 320 and third input terminal 330 that are located inside housing 500.

First input terminal 310 is connected to the anode of first LED 120 via metal wire 600, and third input terminal 330 is electrically connected to the cathode of first LED 120 via die pad 360 provided at the end portion inside housing 500.

Fourth input terminal 340 is connected to the anode of second LED 220 via metal wire 600, and second input terminal 320 is electrically connected to the cathode of second LED 220 via die pad 370 provided at the end portion inside housing 500.

Meanwhile, third input terminal 330 and fourth input terminal 340 are connected to each other by input connecting line 350, as illustrated in FIG. 1A to FIG. 1C. Input connecting line 350 extends in the Y direction, and the surface thereof is covered by light blocker 510 of housing 500. Furthermore, input connecting line 350 is connected to portions of third input terminal 330 and fourth input terminal 340 that are located ahead of the upward bending inside housing 500. Moreover, output connecting line 450 is positioned at the same height as input connecting line 350 from the lower surface of housing 500 in the Z direction.

Note that in the specification of the present application, the term "parallel" or "the same" means being parallel or the same when manufacturing tolerance of components of semiconductor relay module 1000 or assembly tolerance between the components is allowed, and does not mean being parallel or the same among comparison subjects in a strict sense.

As illustrated in FIG. 1A, each of first output terminal 410 and second output terminal 420 is drawn out from a vertically middle portion of housing 500 to the outside of housing 500, is bent, extends downward along a side surface of housing 500, is further bent, and extends along the lower surface of housing 500, substantially parallel to said lower surface. Furthermore, each of first output terminal 410 and second output terminal 420 is bent inside housing 500, extends downward, is further bent, and extends substantially parallel to the lower surface of housing 500. Note that die pad 460 and die pad 490 are provided at end portions of first output terminal 410 and second output terminal 420 that are located inside housing 500.

Each of first to fourth input terminals 310, 320, 330, 340, first output terminal 410, and second output terminal 420 has the aforementioned shape, and semiconductor relay module 1000 constitutes a small outline package (SOP). A portion of each of first to fourth input terminals 310, 320, 330, 340, first output terminal 410, and second output terminal 420 that extends substantially parallel to the lower surface of housing 500 serves as a connecting portion that connects to the mounting substrate not illustrated in the drawings. When semiconductor relay module 1000 is the SOP, semiconductor relay module 1000 can be easily mounted on a surface of the mounting substrate. Furthermore, the portions of first to fourth input terminals 310, 320, 330, 340, first output terminal 410, and second output terminal 420 that are located outside of housing 500 can be positioned closer to housing 500; thus, it is possible to reduce the mounting area for semiconductor relay module 1000 on the mounting substrate.

First output terminal 410 is electrically connected to the drain (D) of MOSFET 161 of first switch 150 via die pad 460 provided at an end portion inside housing 500, and second output terminal 420 is electrically connected to the drain (D) of MOSFET 262 of second switch 250 via die pad 490 provided at an end portion inside housing 500. MOSFET 162 of first switch 150 is mounted on die pad 470, and MOSFET 261 of second switch 250 is mounted on die pad 480.

Note that die pad 140 and die pad 240 disposed in first optocoupler 110 and second optocoupler 210, respectively, and die pads 460, 470 and die pads 480, 490 disposed in first switch 150 and second switch 250, respectively, are positioned at the same height from the lower surface of housing 500 in the Z direction.

Meanwhile, as illustrated in FIG. 1A to FIG. 1C, die pad 470 on which MOSFET 162 of first switch 150 is provided and die pad 480 on which MOSFET 261 of second switch 250 is provided are connected to each other by output connecting line 450. This means that the drain (D) of MOSFET 162 of first switch 150 and the drain (D) of MOSFET 261 of second switch 250 are electrically connected.

Output connecting line 450 includes first portion 450a extending in the Y direction, and the surface thereof is covered by light blocker 510 of housing 500. Furthermore, output connecting line 450 is bent at both ends of first portion 450a to the left in the X direction and is connected to each of die pad 470 and die pad 480.

Next, the operation of semiconductor relay module 1000 will be described with reference to FIG. 1A to FIG. 1C and FIG. 2. Note that in the following description, the drain (D) of MOSFET 161 or die pad 460 having the same electric potential as said drain may be referred to as a first output end of first semiconductor relay 100. The drain (D) of MOSFET 162 or die pad 470 having the same electric potential as said drain may be referred to as a second output end of first semiconductor relay 100.

The drain (D) of MOSFET 261 or die pad 480 having the same electric potential as said drain may be referred to as a first output end of second semiconductor relay 200. The drain (D) of MOSFET 262 or die pad 490 having the same electric potential as said drain may be referred to as a second output end of second semiconductor relay 200.

When a predetermined voltage is applied between first input terminal 310 and second input terminal 320, each of first LED 120 and second LED 220 emits light and outputs an optical signal.

In first semiconductor relay 100, when first LED 120 outputs an optical signal, first PDA 131 of first light-receiving device 130 receives the optical signal and outputs a signal corresponding to the strength of the optical signal. First control circuit 132 applies, to the gate (G) of each of MOSFET 161 and MOSFET 162 of first switch 150, a voltage signal corresponding to the signal that has been output from first PDA 131, and thus charges the gate of each of MOSFET 161 and MOSFET 162.

When the electric potential of the gate (G) of each of MOSFET 161 and MOSFET 162 is greater than or equal to a predetermined value, an electric current flows between the drain (D) and the source (S) of MOSFET 161, and an electric current flows between the drain (D) and the source (S) of MOSFET 162. As a result, the drain (D) of MOSFET 161 and the drain (D) of MOSFET 162 are placed in an electrically conducting state, and first semiconductor relay 100 transitions to the closed state.

Similarly, in second semiconductor relay 200, when second LED 220 outputs an optical signal, second PDA 231 of second light-receiving device 230 receives the optical signal and outputs a signal corresponding to the strength of the optical signal. Second control circuit 232 applies, to the gate (G) of each of MOSFET 261 and MOSFET 262 of second switch 250, a voltage signal corresponding to the signal that has been output from second PDA 231, and thus charges the gate of each of MOSFET 261 and MOSFET 262.

When the electric potential of the gate (G) of each of MOSFET 261 and MOSFET 262 is greater than or equal to a predetermined value, an electric current flows between the drain (D) and the source (S) of MOSFET 261, and an electric current flows between the drain (D) and the source (S) of MOSFET 262. As a result, the drain (D) of MOSFET 261 and the drain (D) of MOSFET 262 are placed in an electrically conducting state, and second semiconductor relay 200 transitions to the closed state.

On the other hand, when no voltage is applied between first input terminal 310 and second input terminal 320, first LED 120 and second LED 220 do not emit light, and first PDA 131 and second PDA 231 do not output signals. In this case, electric charge accumulated in the gate (G) of each of MOSFET 161 and MOSFET 162 of first switch 150 is released via first control circuit 132, and the electric potential of the gate (G) of each of MOSFET 161 and MOSFET 162 is reduced. Electric charge accumulated in the gate (G) of each of MOSFET 261 and MOSFET 262 of second switch 250 is released via second control circuit 232, and the electric potential of the gate (G) of each of MOSFET 261 and MOSFET 262 is reduced.

When the electric potential of the gate (G) of each of MOSFET 161 and MOSFET 162 of first switch 150 is less than or equal to a predetermined threshold value, the electric current no longer flows between the drain (D) and the source (S) of each of MOSFET 161 and MOSFET 162. As a result, the drain (D) of MOSFET 161 and the drain (D) of MOSFET 162 are placed in a non-electrically conducting state, and first semiconductor relay 100 transitions to the open state.

Similarly, when the electric potential of the gate (G) of each of MOSFET 261 and MOSFET 262 of second switch 250 is less than or equal to a predetermined threshold value, the electric current no longer flows between the drain (D) and the source (S) of each of MOSFET 261 and MOSFET 262. As a result, the drain (D) of MOSFET 261 and the drain (D) of MOSFET 262 are placed in a non-electrically conducting state, and second semiconductor relay 200 transitions to the open state.

In other words, first switch 150 is configured to connect and disconnect between the first output end and the second output end of first semiconductor relay 100 according to the output signal from first light-receiving device 130. Second switch 250 is configured to connect and disconnect between the first output end and the second output end of second semiconductor relay 200 according to the output signal from second light-receiving device 230.

Note that third and fourth input terminals 330, 340 are used as input terminals for inspection as described later and therefore, during normal usage, there is no need to apply an external voltage to third and fourth input terminals 330, 340 at the time of applying a predetermined voltage between first input terminal 310 and second input terminal 320.

As described above, when each of first semiconductor relay 100 and second semiconductor relay 200 is in the closed state, first output terminal 410 and second output terminal 420 are in the electrically conducting state, and semiconductor relay module 1000 is in the closed state. When each of first semiconductor relay 100 and second semiconductor relay 200 is in the open state, first output terminal 410 and second output terminal 420 are in the electrically non-conducting state, and semiconductor relay module 1000 is in the open state.

[Processes of Inspecting Semiconductor Relay Module]

Figure 3A:
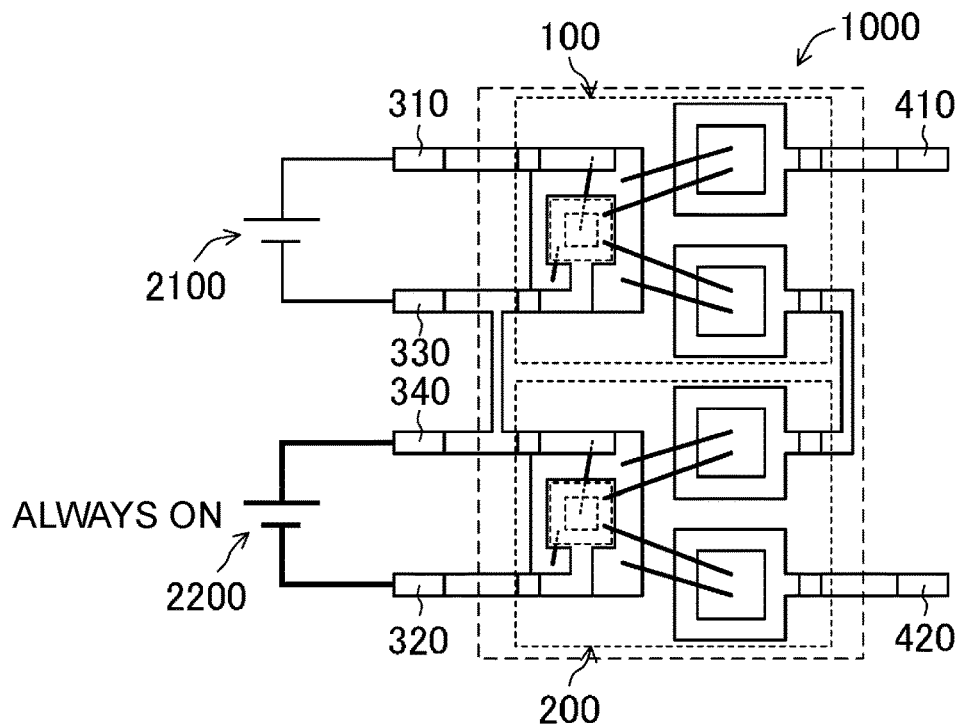
FIG. 3A is a plan view of a semiconductor relay module when a first semiconductor relay is inspected.
Figure 3B:
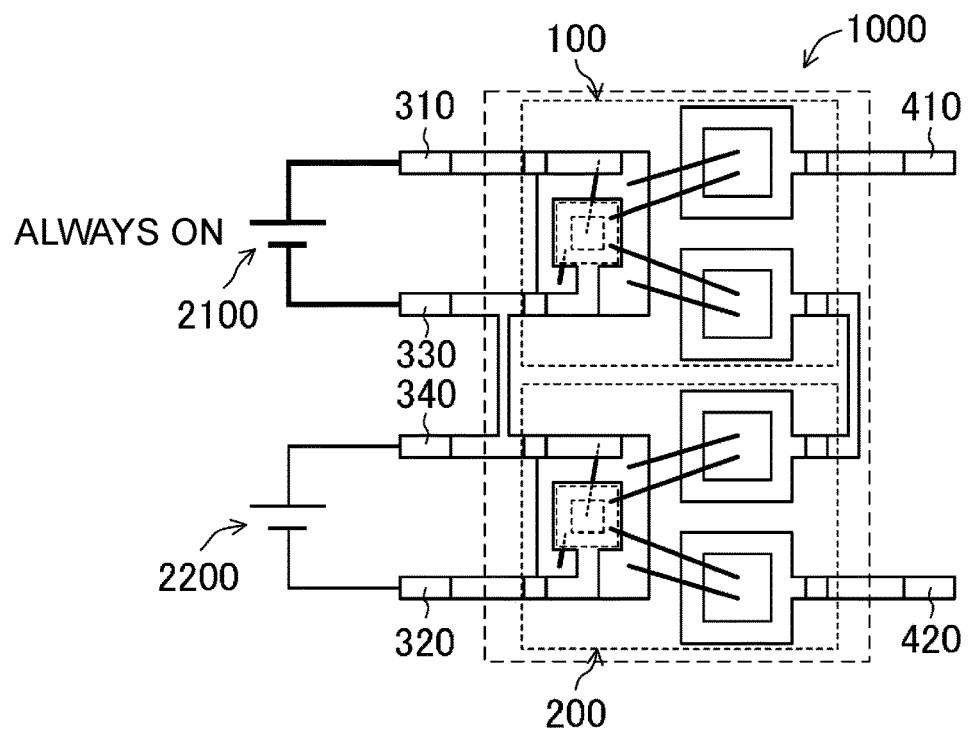
FIG. 3B is a plan view of a semiconductor relay module when a second semiconductor relay is inspected.

FIG. 3A illustrates a plan view of semiconductor relay module 1000 when the first semiconductor relay is inspected, and FIG. 3B illustrates a plan view of semiconductor relay module 1000 when the second semiconductor relay is inspected.

When there is some malfunction in any of the components of semiconductor relay module 100, semiconductor relay module 1000 no longer performs the aforementioned operation. For example, even when the predetermined voltage is applied between first input terminal 310 and second input terminal 320, semiconductor relay module 1000 may remain in the open state and fail to transition to the closed state. Furthermore, even when the application of the voltage between first input terminal 310 and second input terminal 320 is stopped, semiconductor relay module 1000 may remain in the closed state and fail to transition to the open state.

In this case, as illustrated in FIG. 3A, power supply 2200 is connected between fourth input terminal 340 and second input terminal 320, and second LED 220 constantly emits light (is always ON). In this state, in the case where semiconductor relay module 1000 is placed in the closed state when a voltage is applied between first input terminal 310 and third input terminal 330, first semiconductor relay 100 can be regarded as operating properly. Furthermore, in the case where semiconductor relay module 1000 is placed in the open state when the application of the voltage is stopped at a different point in time, first semiconductor relay 100 can be regarded as operating properly.

On the other hand, in the case where semiconductor relay module 1000 is not placed in the closed state when the voltage is applied between first input terminal 310 and third input terminal 330 or in the case where semiconductor relay module 1000 is not placed in the open state when the application of the voltage is stopped, there may be an anomaly inside first semiconductor relay 100.

Furthermore, as illustrated in FIG. 3B, power supply 2100 is connected between first input terminal 310 and third input terminal 330, and first LED 120 constantly emits light (is always ON). In this state, in the case where semiconductor relay module 1000 is placed in the closed state when a voltage is applied between fourth input terminal 340 and second input terminal 320, second semiconductor relay 200 can be regarded as operating properly. Furthermore, in the case where semiconductor relay module 1000 is placed in the open state when the application of the voltage is stopped at a different point in time, second semiconductor relay 200 can be regarded as operating properly.

On the other hand, in the case where semiconductor relay module 1000 is not placed in the closed state when the voltage is applied or in the case where semiconductor relay module 1000 is not placed in the open state when the application of the voltage is stopped, there may be an anomaly inside second semiconductor relay 200.

Note that when the open or closed state of semiconductor relay module 1000 does not change, regardless of whether the connection is as illustrated in FIG. 3A or FIG. 3B, there may be an anomaly in at least one of first semiconductor relay 100 and second semiconductor relay 200. For example, when first LED 120 has a light-emission failure, second semiconductor relay 200 does not change to the closed state, regardless of whether the connection is as illustrated in FIG. 3A or FIG. 3B. Therefore, semiconductor relay module 1000 does not transition to the closed state.

When one of first semiconductor relay 100 and second semiconductor relay 200 is always ON as illustrated in FIG. 3A and FIG. 3B, it is possible to inspect the other semiconductor relay for ON/OFF characteristics, OFF-time withstand voltage measurement, and the like without providing a separate output terminal for inspection in the middle between the output terminal and the output terminal.

[Method for Manufacturing Semiconductor Relay Module]

Figure 5:
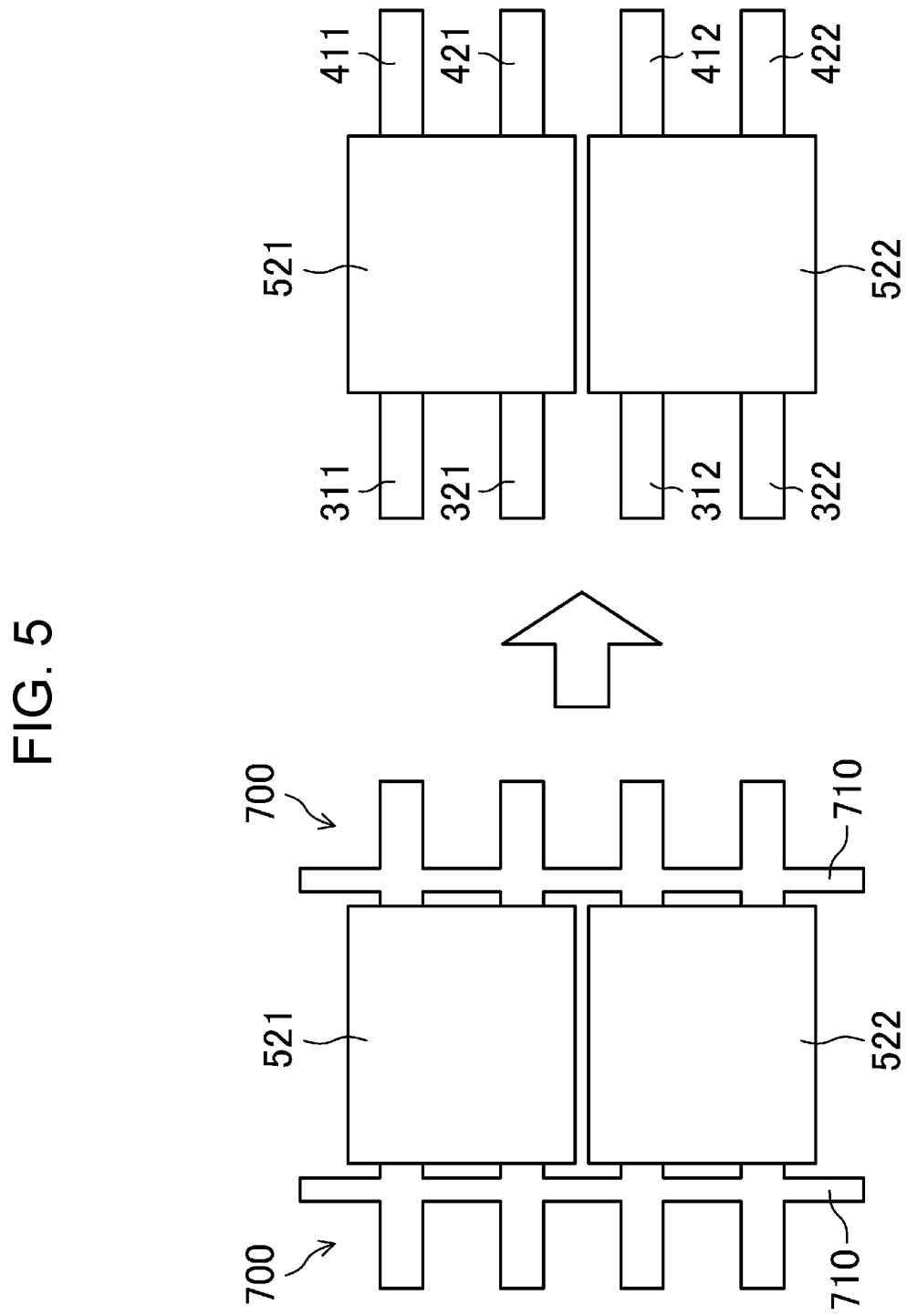
FIG. 5 is a diagram illustrating a part of other processes of manufacturing a semiconductor relay module.
Figure 6:
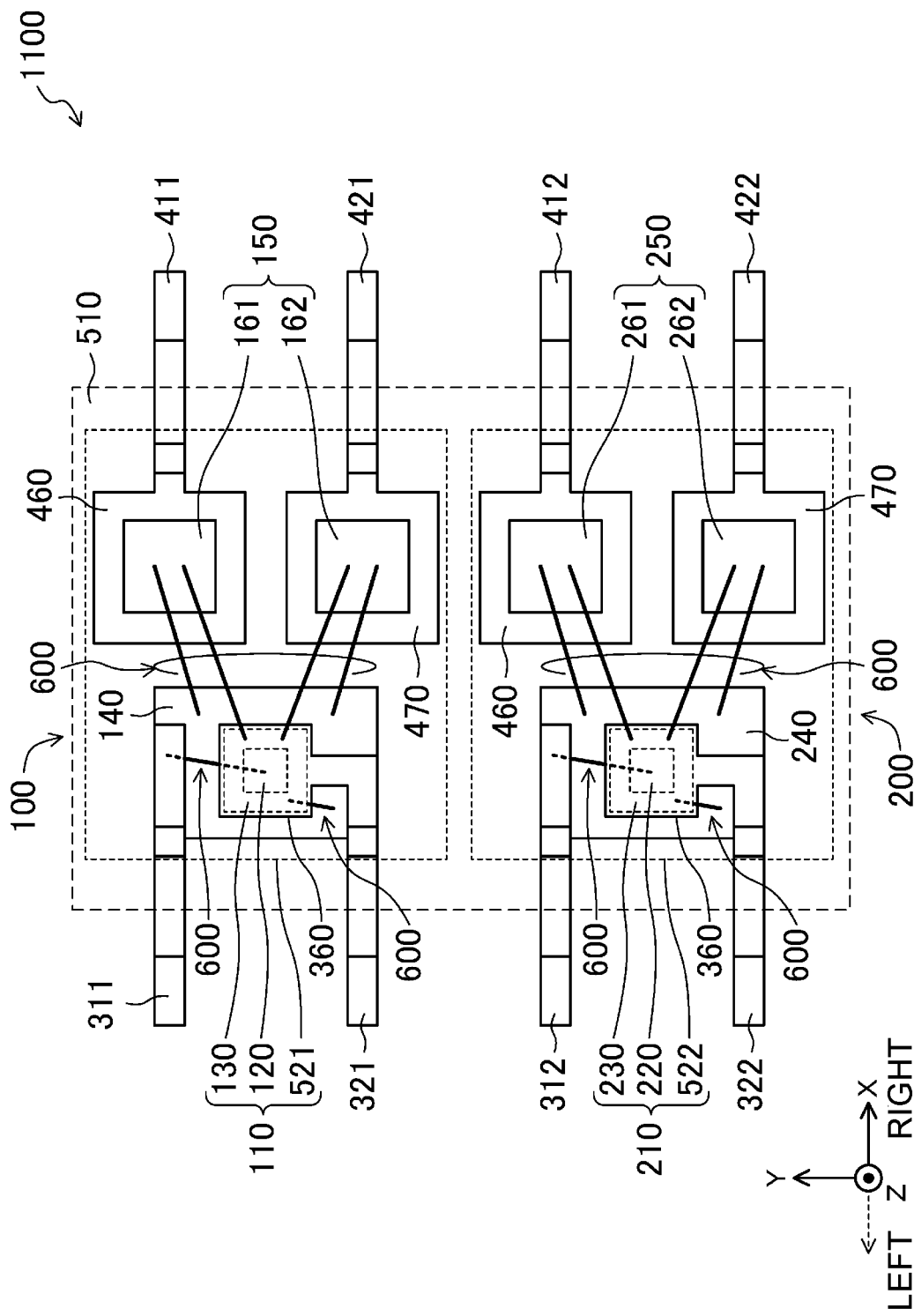
FIG. 6 is a plan view of the semiconductor relay module manufactured through the processes illustrated in FIG. 5.

FIG. 4 is a diagram illustrating a part of processes of manufacturing a semiconductor relay module according to the present exemplary embodiment. FIG. 5 is a diagram illustrating a part of other processes of manufacturing a semiconductor relay module, and FIG. 6 is a plan view of the semiconductor relay module manufactured through the processes illustrated in FIG. 5.

The diagram illustrated on the left side in FIG. 4 illustrates a situation where lead frame 700 having mounted thereon components for first optocoupler 110, second optocoupler 210, first switch 150, and second switch 250 is sealed by a light transmissive resin for first light transmissive part 521 and second light transmissive part 522. Note that at this time, although not illustrated in FIG. 4, first LED 120, second LED 220, first light-receiving device 130, second light-receiving device 230, and the like are mounted on die pads 360, 370, 140, 240, which are portions of lead frame 700 disposed inside first light transmissive part 521 and second light transmissive part 522, and metal wires 600 are bonded in predetermined positions.

Portions of lead frame 700, namely, primary tie bar 710, first to fourth input terminals 310, 320, 330, 340, first output terminal 410, and second output terminal 420 protrude outward from first light transmissive part 521 and second light transmissive part 522. First to fourth input terminals 310, 320, 330, 340 are connected to each other by primary tie bar 710 extending in a direction intersecting the direction in which first to fourth input terminals 310, 320, 330, 340 extend. First output terminal 410 and second output terminal 420 are connected to each other by primary tie bar 710 extending in a direction intersecting the direction in which first output terminal 410 and second output terminal 420 extend. Note that no output terminals are provided at positions opposing third input terminal 330 and fourth input terminal 340; these portions are cut off from primary tie bar 710 before the process illustrated in FIG. 4.

Next, portions of primary tie bar 710 are cut off, as illustrated on the right side in FIG. 4. At this time, primary tie bar 710 that connects third input terminal 330 and fourth input terminal 340 is left. Furthermore, primary tie bar 710 that connects portions from which the output terminals have been cut off in advance is also left. Former primary tie bar 710 corresponds to input connecting line 350, and latter primary tie bar 710 corresponds to output connecting line 450. Thereafter, first light transmissive part 521, second light transmissive part 522, and left primary tie bars 710 are covered by the light-blocking resin (not illustrated in the drawings) that constitutes light blocker 510, and thus semiconductor relay module 1000 is obtained.

According to the present exemplary embodiment, primary tie bar 710 included in lead frame 700 can be used as input connecting line 350, output connecting line 450, and the like, and separate processes of forming these can be omitted. Thus, the manufacturing cost of semiconductor relay module 1000 can be reduced.

Furthermore, by using lead frame 700 according to the present exemplary embodiment, it is possible to easily manufacture semiconductor relay module 1100 of a different type. This will be described with reference to FIG. 5 and FIG. 6.

The process illustrated in FIG. 5 corresponds to the process illustrated in FIG. 4. However, in the example illustrated in FIG. 5, second output terminal 421 and first output terminal 412 provided at positions opposing second input terminal 321 and first input terminal 312 are not cut off from primary tie bar 710 and are left.

In this state, primary tie bar 710 is cut off both on the input side and the output side. Subsequently, first light transmissive part 521 and second light transmissive part 522 are covered by the light-blocking resin that constitutes light blocker 510.

This makes it possible to manufacture semiconductor relay module 1100 illustrated in FIG. 6 in which first semiconductor relay 100 and second semiconductor relay 200, which perform the opening/closing operation independently of each other, are integrated in one package.

As illustrated in FIG. 6, first semiconductor relay 100 includes first input terminal 311, second input terminal 321, first output terminal 411, and second output terminal 421. Second semiconductor relay 200 includes first input terminal 312, second input terminal 322, first output terminal 412, and second output terminal 422.

Advantageous Effects, Etc

As described above, semiconductor relay module 1000 according to the present exemplary embodiment includes: at least first semiconductor relay 100; second semiconductor relay 200; housing 500 which covers first semiconductor relay 100 and second semiconductor relay 200; first to fourth input terminals 310, 320, 330, 340 which are exposed from housing 500; and first output terminal 410 and second output terminal 420 which are exposed from housing 500.

First semiconductor relay 100 includes: first optocoupler 110 including first LED 120 and first light-receiving device 130 which receives the optical signal from first LED 120; and first switch 150 including MOSFET 161 and MOSFET 162. MOSFET 161 and MOSFET 162 connect and disconnect between the first output end and the second output end, which are provided on MOSFET 161 and MOSFET 162, respectively, according to the output signal from first light-receiving device 130.

Second semiconductor relay 200 includes: second optocoupler 210 including second LED 220 and second light-receiving device 230 which receives the optical signal from second LED 220; and second switch 250 including MOSFET 261 and MOSFET 262. MOSFET 261 and MOSFET 262 connect and disconnect between the first output end and the second output end, which are provided on MOSFET 261 and MOSFET 262, respectively, according to the output signal from second light-receiving device 230.

First input terminal 310 is connected to the anode of first LED 120 of first semiconductor relay 100, and second input terminal 320 is connected to the cathode of second LED 220 of second semiconductor relay 200. The cathode of first LED 120 of first semiconductor relay 100 and the anode of second LED 220 of second semiconductor relay 200 are electrically connected via input connecting line 350.

First output terminal 410 is connected to die pad 460 which is the first output end of first semiconductor relay 100, and second output terminal 420 is connected to die pad 490 which is the second output end of second semiconductor relay 200. Die pad 470 which is the second output end of first semiconductor relay 100 and die pad 480 which is the first output end of second semiconductor relay 200 are connected via output connecting line 450.

Semiconductor relay module 1000 further includes third input terminal 330 and fourth input terminal 340 which are connected to input connecting line 350 and exposed from housing 500. Input connecting line 350 and output connecting line 450 are covered by housing 500.

According to the present exemplary embodiment, first input terminal 310 and third input terminal 330 are connected to first LED 120, and fourth input terminal 340 and second input terminal 320 are connected to second LED 220.

Thus, as described with reference to FIG. 3A and FIG. 3B, first semiconductor relay 100 and second semiconductor relay 200 are capable of operating independently of each other. Furthermore, this allows first semiconductor relay 100 and second semiconductor relay 200 to be inspected independently of each other.

Third input terminal 330 and fourth input terminal 340 are connected by input connecting line 350. With this, it is possible to operate first semiconductor relay 100 and second semiconductor relay 200 integrally as one semiconductor relay by applying a predetermined voltage between first input terminal 310 and second input terminal 320.

Furthermore, according to the present exemplary embodiment, the insulation distance between first output terminal 410 and second output terminal 420 can be secured, and the withstand voltage between first output terminal 410 and second output terminal 420 can be increased. This will be further described.

Figure 7:
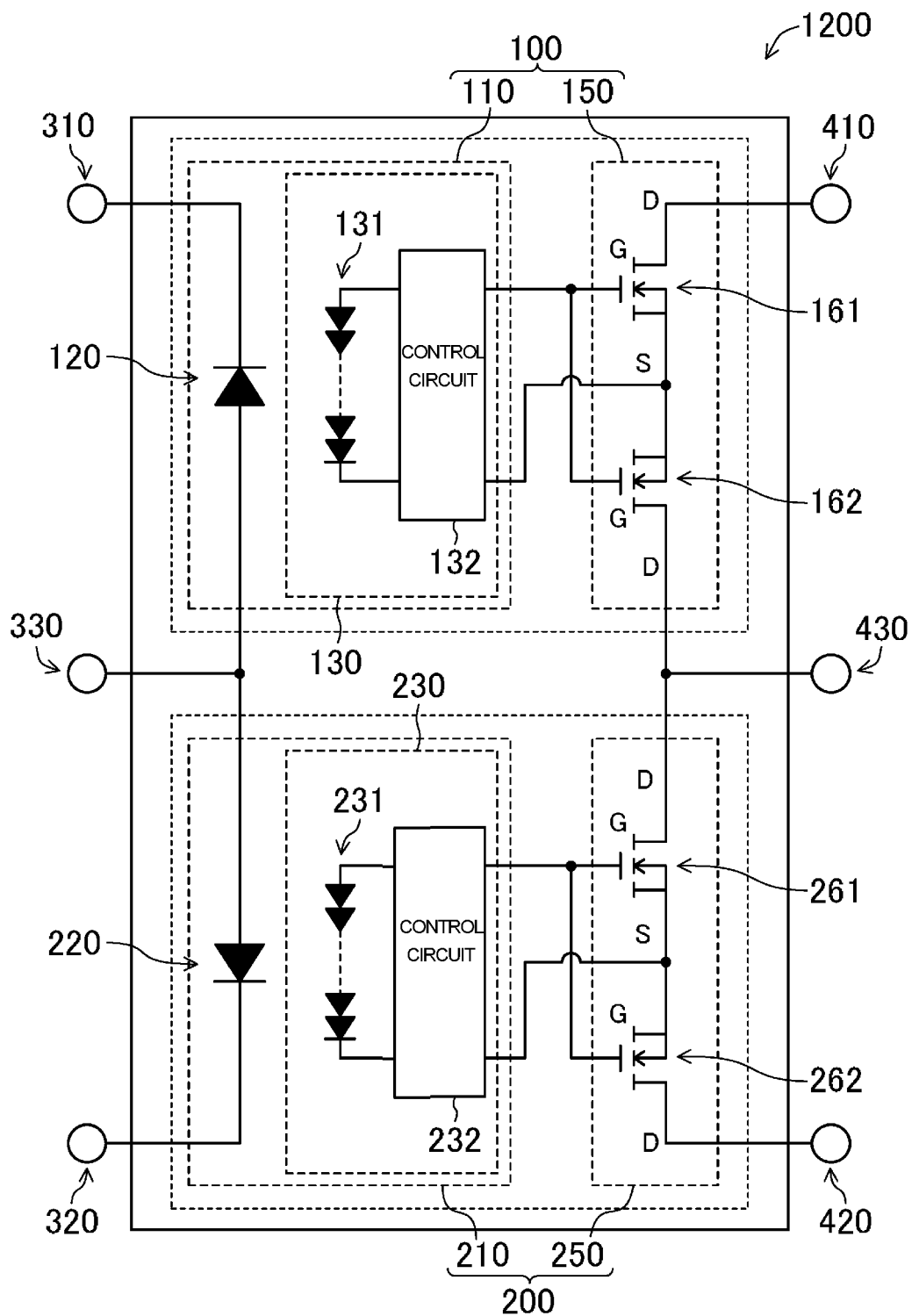
FIG. 7 is a circuit diagram of a semiconductor relay module for the sake of comparison.

FIG. 7 illustrates a circuit diagram of the semiconductor relay module for the sake of comparison. The circuit illustrated in FIG. 7 corresponds to the conventional circuit disclosed in PTL 2.

Semiconductor relay module 1200 illustrated in FIG. 7 includes three input terminals. Power supplies not illustrated in the drawings are connected between first input terminal 310 and third input terminal 330 and between third input terminal 330 and second input terminal 320, and thus each of first LED 120 and second LED 220 can be driven independently. This allows each of first semiconductor relay 100 and second semiconductor relay 200 to operate independently and be inspected independently. Furthermore, it is possible to operate first semiconductor relay 100 and second semiconductor relay 200 integrally as one semiconductor relay.

Semiconductor relay module 1200 illustrated in FIG. 7 includes three output terminals; intermediate terminal 430 is provided between first output terminal 410 and second output terminal 420 as an output terminal for inspection. Therefore, when first semiconductor relay 100 and second semiconductor relay 200 operate integrally as one semiconductor relay, the insulation distance between the output terminals in semiconductor relay module 1200 is reduced to the distance between first output terminal 410 and intermediate terminal 430 or the distance between intermediate terminal 430 and second output terminal 420. Thus, it is problematic in that the withstand voltage between first output terminal 410 and second output terminal 420 in semiconductor relay module 1200 in the open state cannot be increased.

In contrast, according to the present exemplary embodiment, first switch 150 and second switch 250 are connected in series by output connecting line 450, and moreover intermediate terminal 430 illustrated in FIG. 7 is not provided. Thus, the insulation distance between first output terminal 410 and second output terminal 420 can be secured, and the withstand voltage between first output terminal 410 and second output terminal 420 can be increased.

Particularly, in semiconductor relay module 1000 according to the present exemplary embodiment, first LED 120 and first PDA 131 are electrically insulated and separated, and second LED 220 and second PDA 231 are electrically insulated and separated. This means that semiconductor relay module 1000 is a relay switch with an input and an output isolated therebetween. Thus, the circuit on the input side, specifically, first optocoupler 110 and second optocoupler 210, can be operated without being affected by the circuit on the output side.

According to the present exemplary embodiment, the withstand voltage between first output terminal 410 and second output terminal 420 can be increased, and thus it is possible to mitigate voltage constraints on loads to be connected to first output terminal 410 and second output terminal 420.

Light blocker 510, which is made of a light-blocking resin and blocks the optical signal emitted from each of first LED 120 and second LED 220, is disposed between first optocoupler 110 of first semiconductor relay 100 and second optocoupler 210 of second semiconductor relay 200.

This makes it possible to prevent leakage of the optical signal from first LED 120 into second semiconductor relay 200 and prevent leakage of the optical signal from second LED 220 into first semiconductor relay 100. Thus, when one of first semiconductor relay 100 and second semiconductor relay 200 operates independently, the occurrence of erroneous operation of the other semiconductor relay can be reduced and, by extension, the accuracy of inspection in which each of first semiconductor relay 100 and second semiconductor relay 200 is inspected independently can be ensured.

Output connecting line 450 is preferably covered in its entirety by housing 500.

This allows output connecting line 450 to be reliably covered by housing 500, which is an insulating resin structure. Therefore, the insulation distance between first output terminal 410 and second output terminal 420 can be secured, and the withstand voltage between first output terminal 410 and second output terminal 420 can be increased.

First semiconductor relay 100 and second semiconductor relay 200 are arranged side-by-side in the Y direction (the first direction). First portion 450a, which extends in the Y direction, of output connecting line 450 is covered by housing 500. First portion 450a is disposed apart from first light transmissive part 521 and second light transmissive part 522, which are made of a light transmissive resin formed in first optocoupler 110 and second optocoupler 210, on the right side in the X direction (the second direction).

Thus, the optical signal that is output from each of first LED 120 and second LED 220 can be prevented from reaching first portion 450a of output connecting line 450, being reflected and diffused, and entering first PDA 131 and second PDA 231 as stray light. This can lead to improved accuracy of inspection in which each of first semiconductor relay 100 and second semiconductor relay 200 is inspected. Furthermore, the internal wiring layout of semiconductor relay module 1000 can be simplified.

A portion of input connecting line 350 that extends in the Y direction is covered by housing 500 and is disposed apart from first light transmissive part 521 and second light transmissive part 522, which are made of a light transmissive resin formed in first optocoupler 110 and second optocoupler 210, on the left side in the X direction.

Thus, the optical signal that is output from each of first LED 120 and second LED 220 can be prevented from reaching input connecting line 350, being reflected and diffused, and entering first PDA 131 and second PDA 231 as stray light. This can lead to improved accuracy of inspection in which each of first semiconductor relay 100 and second semiconductor relay 200 is inspected. Furthermore, the internal wiring layout of semiconductor relay module 1000 can be simplified.

First semiconductor relay 100 includes MOSFET 161 and MOSFET 162, and second semiconductor relay 200 includes MOSFET 261 and MOSFET 262. MOSFET 161 provided in first semiconductor relay 100 and MOSFET 261 provided in second semiconductor relay 200 are arranged so that the sources (S) and the drains (D) thereof are aligned in the same direction. MOSFET 162 provided in first semiconductor relay 100 and MOSFET 262 provided in second semiconductor relay 200 are arranged so that the sources (S) and the drains (D) thereof are aligned in the same direction.

This makes it possible to increase the withstand voltage between first output terminal 410 and second output terminal 420 to twice as high as that in the case where semiconductor relay module 1000 includes only one of first semiconductor relay 100 and second semiconductor relay 200.

Note that the present exemplary embodiment exemplifies the case where MOSFET 161 and MOSFET 162 are included in first semiconductor relay 100 and MOSFET 261 and MOSFET 262 are included in second semiconductor relay 200, but the number of MOSFETs included in first semiconductor relay 100 and the number of MOSFETs included in second semiconductor relay 200 are not limited to these. For example, three or more MOSFETs may be included in each of first semiconductor relay 100 and second semiconductor relay 200.

Even in this case, it is possible to increase the withstand voltage between first output terminal 410 and second output terminal 420 by determining the arrangement of the MOSFETs as described below.

Specifically, each of first semiconductor relay 100 and second semiconductor relay 200 includes a plurality of MOSFETs. At least one MOSFET provided in first semiconductor relay 100 and at least one MOSFET provided in second semiconductor relay 200 are arranged so that the sources (S) and the drains (D) thereof are aligned in the same direction.

First semiconductor relay 100 includes MOSFET 161 and MOSFET 162 electrically connected in series, and the source (S) of MOSFET 161 and the source (S) of MOSFET 162 are electrically connected to each other. Second semiconductor relay 200 includes MOSFET 261 and MOSFET 262 electrically connected in series, and the source (S) of MOSFET 261 and the source (S) of MOSFET 262 are electrically connected to each other.

First semiconductor relay 100 includes first light-receiving device 130. First light-receiving device 130 includes: first PDA 131 which receives the optical signal from first LED 120; and first control circuit 132 which drives MOSFET 161 and MOSFET 162. In first semiconductor relay 100, the gate (G) of each of MOSFET 261 and MOSFET 262 is electrically connected to first control circuit 132 via metal wire 600. The drain (D) of MOSFET 161 and the drain (D) of MOSFET 162 are electrically connected via an electrically conductive adhesive material to die pad 460 and die pad 470, which are separate die pads, respectively. Specifically, with the electrically conductive adhesive material, the lower surface of each of MOSFET 161 and MOSFET 162 and the upper surface of the die pad that is the lead frame are joined together. The source (S) of each of MOSFET 161 and MOSFET 162 is connected to die pad 140 having mounted thereon first light-receiving device 130 via metal wire 600 and thus is electrically connected to first control circuit 132.

Second semiconductor relay 200 includes second light-receiving device 230. Second light-receiving device 230 includes: second PDA 231 which receives the optical signal from second LED 220; and second control circuit 232 which drives MOSFET 261 and MOSFET 262. In second semiconductor relay 200, the gate (G) of each of MOSFET 261 and MOSFET 262 is electrically connected to second control circuit 232 via metal wire 600. The drain (D) of MOSFET 261 and the drain (D) of MOSFET 262 are electrically connected via an electrically conductive adhesive material to die pad 480 and die pad 490, which are separate die pads, respectively. Specifically, with the electrically conductive adhesive material, the lower surface of each of MOSFET 261 and MOSFET 262 and the upper surface of the die pad that is the lead frame are joined together. The source (S) of each of MOSFET 261 and MOSFET 262 is connected to die pad 240 having mounted thereon second light-receiving device 230 via metal wire 600 and thus is electrically connected to second control circuit 232.

When first semiconductor relay 100 and second semiconductor relay 200 are configured as described above, first switch 150 and second switch 250 constitute a circuit that is symmetric as viewed from the intermediate potential between first output terminal 410 and second output terminal 420, for example, output connecting line 450. With this, for example, regardless of whether the output of a load connected between first output terminal 410 and second output terminal 420 is DC or AC, semiconductor relay module 100 can be used as a relay switch with an input and an output isolated therebetween.

Furthermore, electrically connecting first control circuit 132, the source (S) of MOSFET 161, and the source (S) of MOSFET 162 becomes easy. Similarly, electrically connecting second control circuit 232, the source (S) of MOSFET 261, and the source (S) of MOSFET 262 becomes easy.

Furthermore, by connecting the drains (D) of first to fourth MOSFETs 161, 162, 261, 262 to die pads 460, 470, 480, 490, respectively, it is possible to easily dissipate heat from first to fourth MOSFETs 161, 162, 261, 262 via die pads 460, 470, 480, 490 during operation of semiconductor relay module 1000. This leads to stabile operation of semiconductor relay module 1000 and also increased operation reliability thereof.

Furthermore, three or more MOSFETs may be included in each of first semiconductor relay 100 and second semiconductor relay 200, as mentioned earlier.

In this case, by determining the connection relationship of the MOSFETs, the die pads, and the like as follows, it is possible to use semiconductor relay module 1000 regardless of whether the output of a load connected between first output terminal 410 and second output terminal 420 is DC or AC.

Specifically, in first semiconductor relay 100, the gate (G) of each of the plurality of MOSFETs is electrically connected to first control circuit 132 via metal wire 600. The drains (D) of the plurality of MOSFETs are electrically connected via an electrically conductive adhesive material to die pads that are separate from each other. The source (S) of each of the plurality of MOSFETs is connected to die pad 140 having mounted thereon first light-receiving device 130 via metal wire 600 and thus is electrically connected to first control circuit 132.

In second semiconductor relay 200, the gate (G) of each of the plurality of MOSFETs is electrically connected to second control circuit 232 via metal wire 600. The drains (D) of the plurality of MOSFETs are electrically connected via an electrically conductive adhesive material to die pads that are separate from each other. The source (S) of each of the plurality of MOSFETs is connected to die pad 240 having mounted thereon second light-receiving device 230 via metal wire 600 and thus is electrically connected to second control circuit 232.

Note that as mentioned earlier, first control circuit 132 is a charging/discharging circuit for the gate (G) of each of MOSFET 161 and MOSFET 162. Second control circuit 232 is a charging/discharging circuit for the gate (G) of each of MOSFET 261 and MOSFET 262. Although not illustrated in the drawings, various circuit configurations can be selected for first control circuit 132 and second control circuit 232. For example, a depression-type MOSFET (D-MOSFET; not illustrated in the drawings) and a resistor (not illustrated in the drawings) that connects the gate (G) and the source (S) of the D-MOSFET may constitute each of first control circuit 132 and second control circuit 232. Alternatively, each of first control circuit 132 and second control circuit 232 may be configured of only a resistor having a predetermined resistance value.

<Variation 1>

Figure 8:
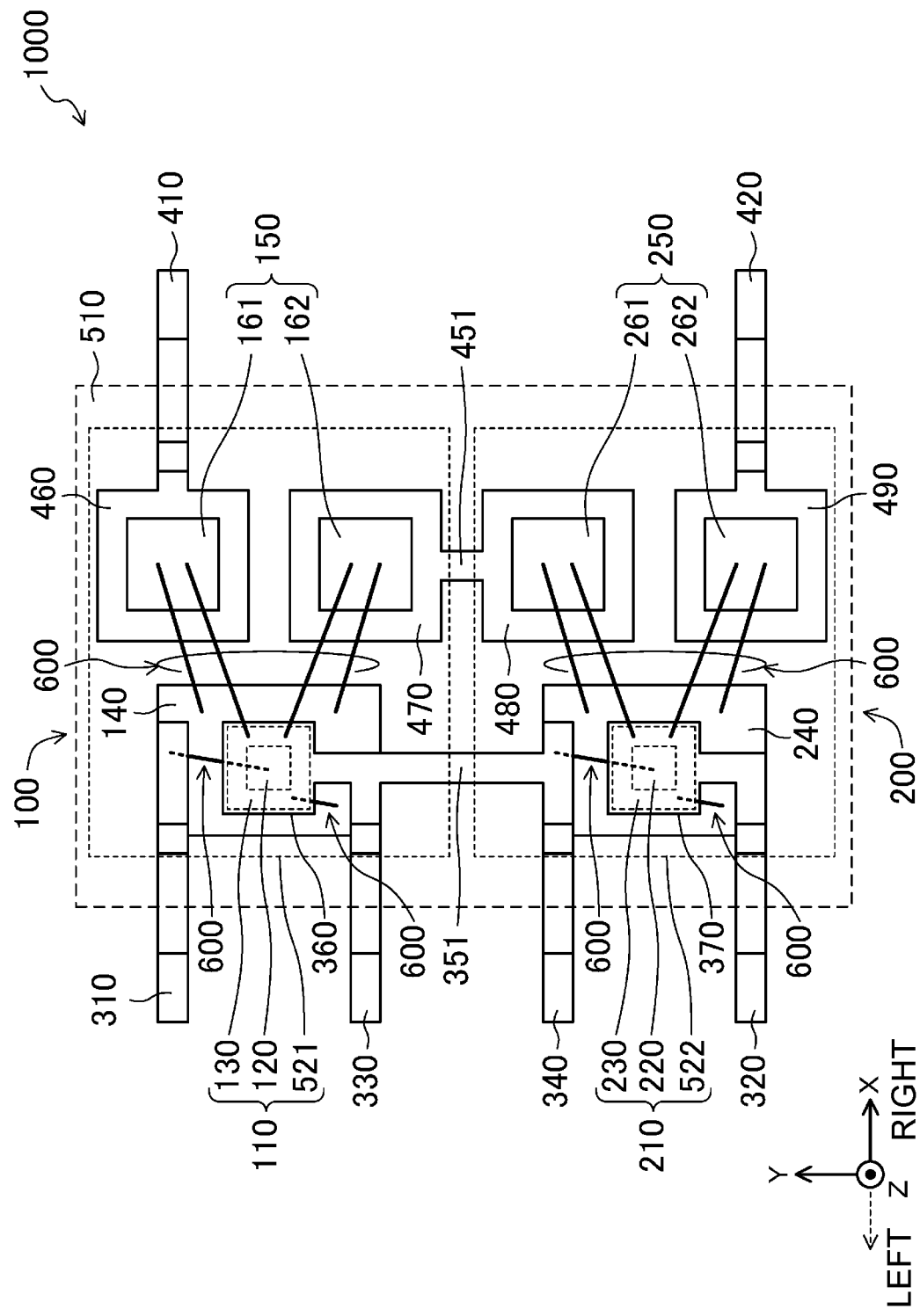
FIG. 8 is a plan view of a semiconductor relay module according to Variation 1.

FIG. 8 illustrates a plan view of semiconductor relay module 1000 according to Variation 1. Note that in FIG. 8 and figures that follow, portions that are substantially the same as those according to Embodiment 1 are assigned the same reference marks and as such, detailed description thereof will be omitted.

The configuration according to the present variation illustrated in FIG. 8 is different from the configuration according to Embodiment 1 illustrated in FIG. 1B in that input connecting line 351 and output connecting line 451 extend in the Y direction and are provided across first light transmissive part 521, second light transmissive part 522, and light blocker 510.

For example, as illustrated in FIG. 8, input connecting line 351 extends from a bent portion of third input terminal 330 toward fourth input terminal 340 and is connected to fourth input terminal 340. Output connecting line 451 extends from an X-wise central portion of die pad 470 toward die pad 480 and is connected to an X-wise central portion of die pad 480.

In the present variation, it is possible to produce advantageous effects that are substantially the same as those produced by the configuration described in Embodiment 1. Specifically, it is possible to operate each of first semiconductor relay 100 and second semiconductor relay 200 independently and furthermore inspect each of first semiconductor relay 100 and second semiconductor relay 200 independently. Moreover, the withstand voltage between first output terminal 410 and second output terminal 420 can be increased. Note that when the height of output connecting line 451 and the height of die pad 470 and die pad 480 from the bottom surface of housing 500 are set equal, the optical signal that is output from each of first LED 120 and second LED 220 can be easily prevented from being reflected and diffused by output connecting line 451.

<Variation 2>

Figure 9:
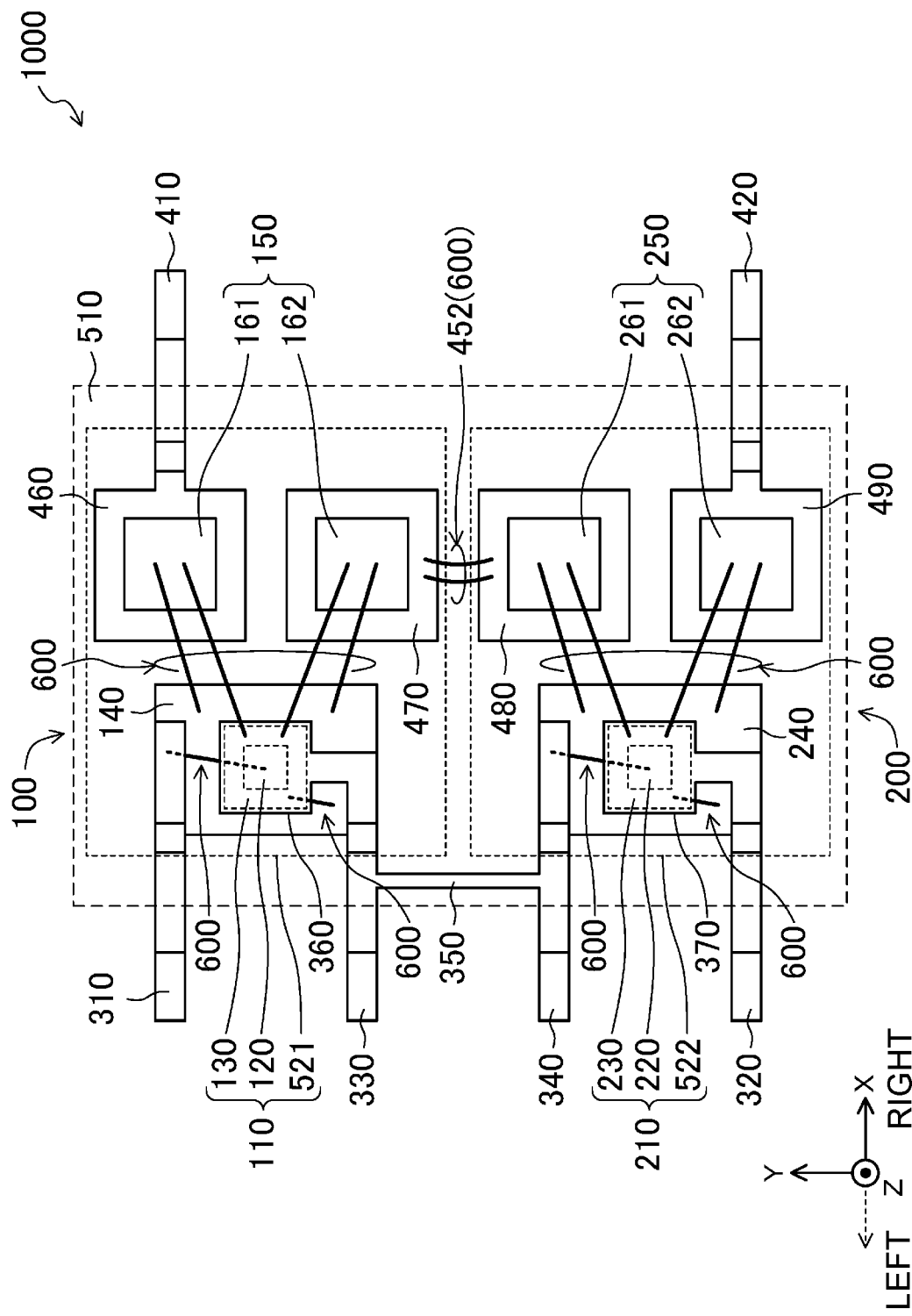
FIG. 9 is a plan view of a semiconductor relay module according to Variation 2.

FIG. 9 illustrates a plan view of semiconductor relay module 1000 according to Variation 2.

The configuration according to the present variation illustrated in FIG. 9 is different from the configuration according to Embodiment 1 illustrated in FIG. 1B in that output connecting line 452 is formed of metal wire 600. Furthermore, the configuration is different from the configuration according to Embodiment 1 illustrated in FIG. 1B in that metal wire 600 is provided across first light transmissive part 521, second light transmissive part 522, and light blocker 510 and connects die pad 470 and die pad 480.

In the present variation, it is also possible to produce advantageous effects that are substantially the same as those produced by the configuration described in Embodiment 1. Specifically, it is possible to operate each of first semiconductor relay 100 and second semiconductor relay 200 independently and furthermore inspect each of first semiconductor relay 100 and second semiconductor relay 200 independently. Moreover, the withstand voltage between first output terminal 410 and second output terminal 420 can be increased.

Note that the number of metal wires 600 constituting output connecting line 452 or the diameter of metal wires 600 constituting output connecting line 452 may be changed, as appropriate, according to the values of output currents flowing through first switch 150 and second switch 250.

<Variation 3>

Figure 10A:
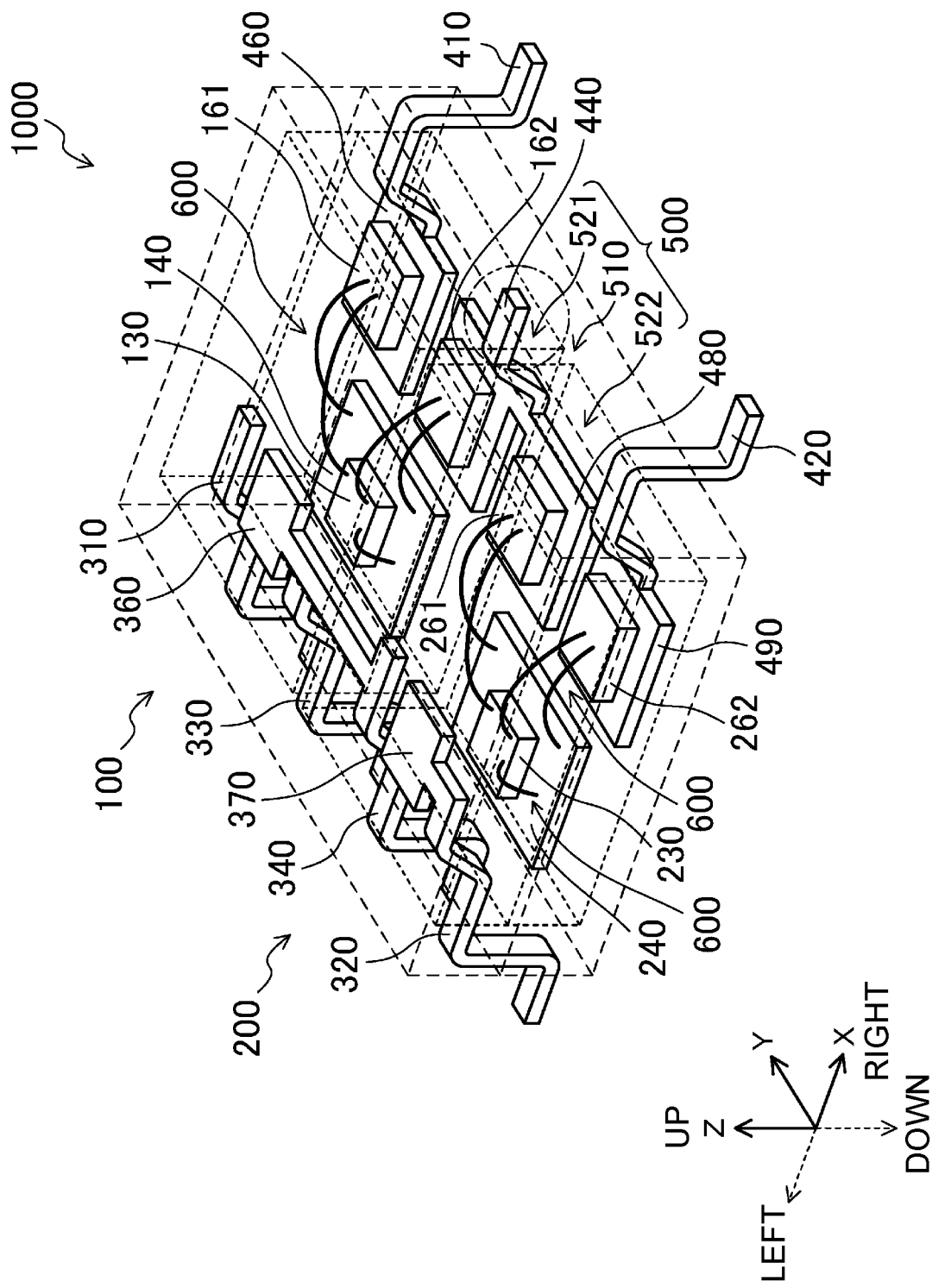
FIG. 10A is a perspective view of a semiconductor relay module according to Variation 3.
Figure 10B:
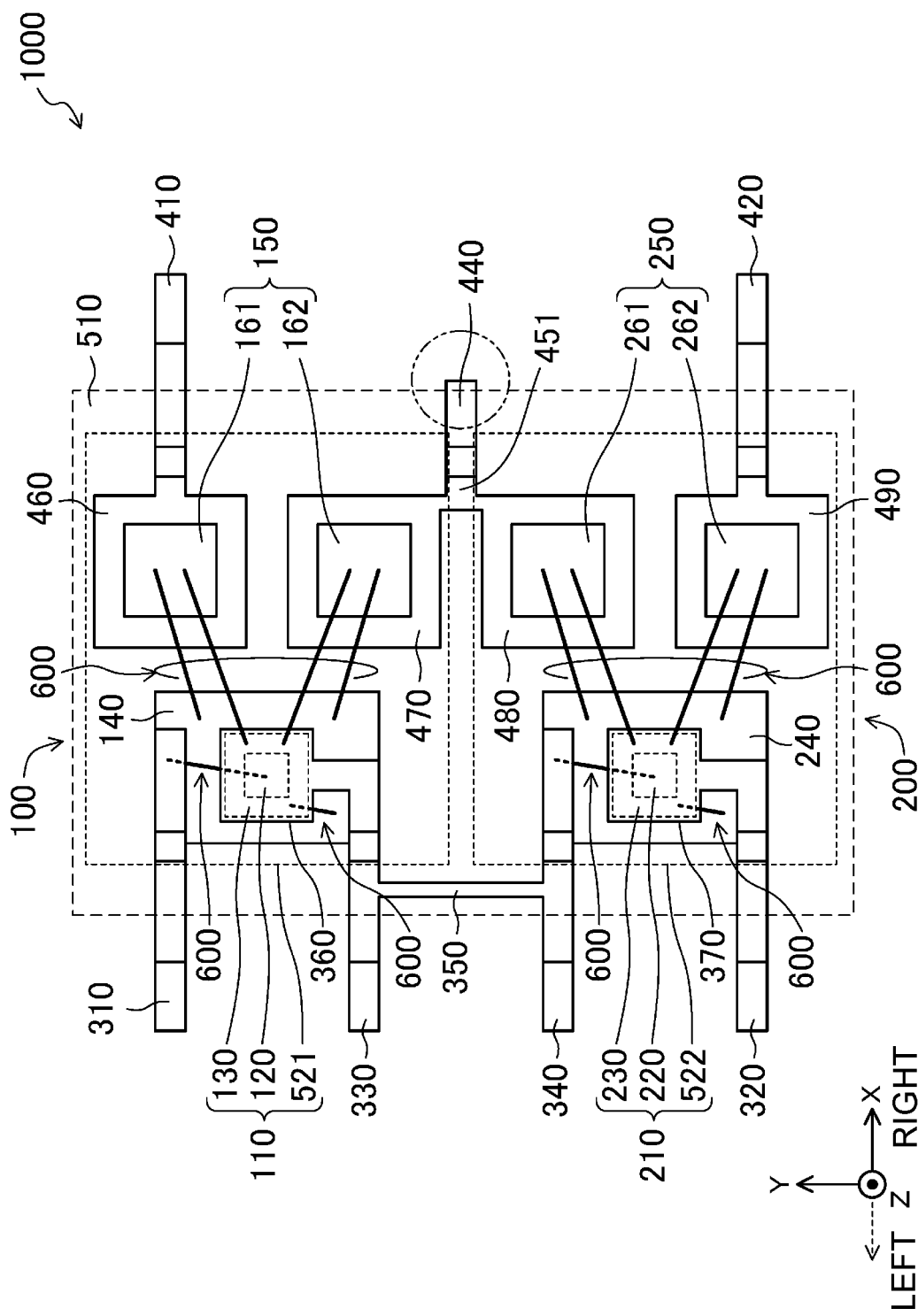
FIG. 10B is a plan view of a semiconductor relay module according to Variation 3.

FIG. 10A is a perspective view of semiconductor relay module 1000 according to Variation 3, and FIG. 10B is a plan view of semiconductor relay module 1000 according to Variation 3.

The configuration according to the present variation illustrated in FIG. 10A and FIG. 10B is different from the configuration according to Variation 1 illustrated in FIG. 8 in that intermediate terminal 440 is provided extending from a point midway through output connecting line 451 to the outside of housing 500. Note that as indicated by the dashed circle in FIG. 10A and FIG. 10B, intermediate terminal 440 has a downwardly extending portion removed outside housing 500 unlike first output terminal 410 and second output terminal 420. Thus, when semiconductor relay module 1000 according to the present variation is mounted on the mounting substrate not illustrated in the drawings, intermediate terminal 440 is not connected to the mounting substrate and does not contribute to electrical operation of semiconductor relay module 1000.

In the present variation, it is also possible to produce advantageous effects that are substantially the same as those produced by the configuration described in Embodiment 1. Specifically, it is possible to operate each of first semiconductor relay 100 and second semiconductor relay 200 independently and furthermore inspect each of first semiconductor relay 100 and second semiconductor relay 200 independently. Moreover, the withstand voltage between first output terminal 410 and second output terminal 420 can be increased.

Furthermore, as described in the present variation, intermediate terminal 440 which does not contribute to the operation of semiconductor relay module 1000 may be provided. Note that when intermediate terminal 440 is provided extending from output connecting line 451 to the outside of housing 500, the strength of adhesion between housing 500 and output connecting line 451 and, by extension, the strength of adhesion between housing 500 and die pads 470, 480, can be increased.

Embodiment 2

Figure 11:
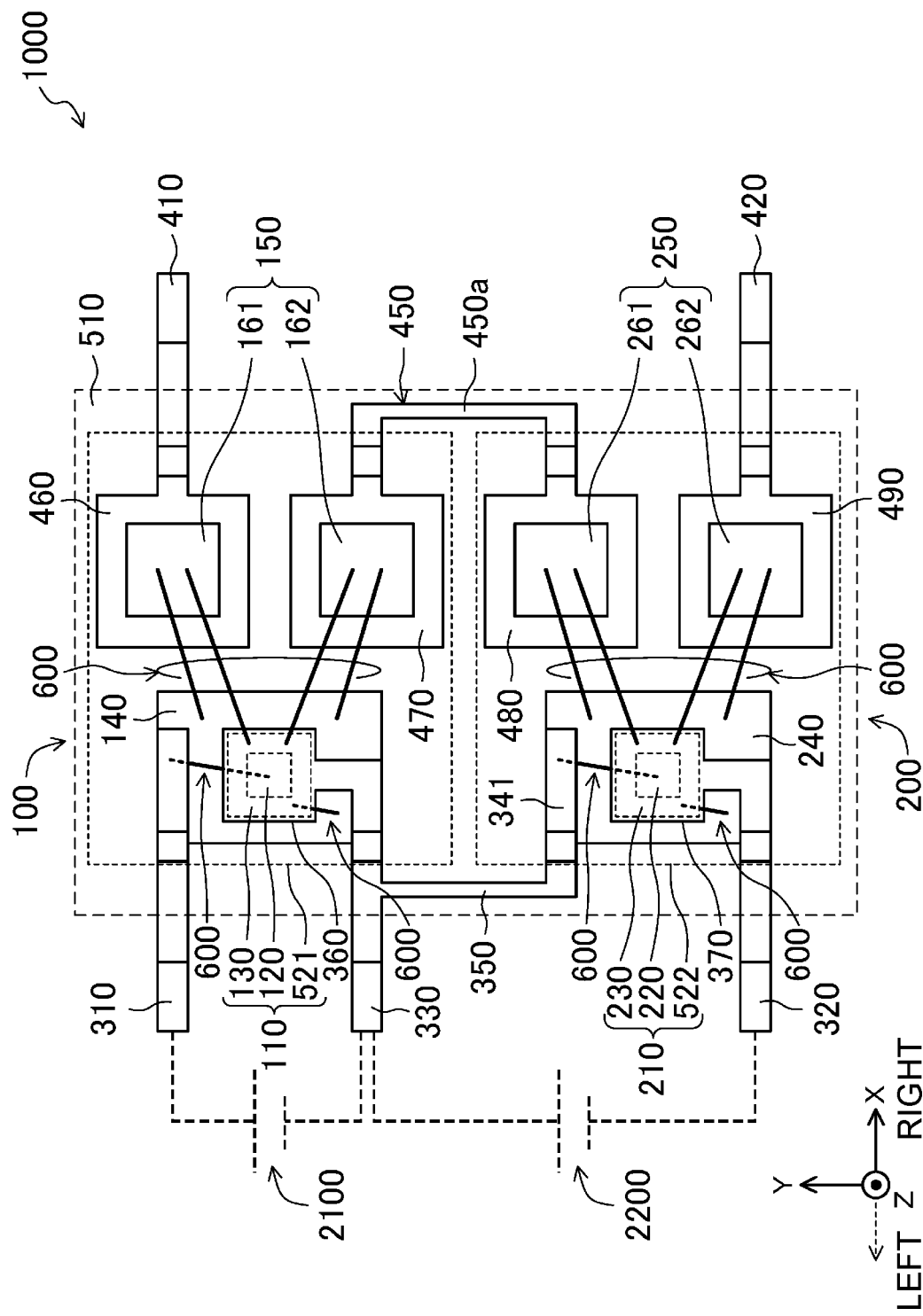
FIG. 11 is a plan view of a semiconductor relay module according to Embodiment 2.

FIG. 11 is a plan view of semiconductor relay module 1000 according to Embodiment 2.

The configuration according to the present exemplary embodiment illustrated in FIG. 11 is different from the configuration according to Embodiment 1 illustrated in FIG. 1A to FIG. 1C in that there are three input terminals. Specifically, in the configuration illustrated in FIG. 11, fourth input terminal 340 illustrated in FIG. 1B is omitted. In other words, semiconductor relay module 1000 includes third input terminal 330 which is connected to input connecting line 350 and exposed from housing 500. Note that third input terminal 330 is connected to internal terminal 341 via input connecting line 350 inside housing 500. Metal wire 600 having one end connected to the anode of second LED 220 is connected to internal terminal 341 at the other end.

In the present exemplary embodiment, it is also possible to produce advantageous effects that are substantially the same as those produced by the configuration described in Embodiment 1. First, by individually applying a voltage between first input terminal 310 and third input terminal 330 and a voltage between third input terminal 330 and second input terminal 320, it is possible to independently operate first LED 120 and second LED 220 and, by extension, first optocoupler 110 and second optocoupler 210. This allows each of first semiconductor relay 100 and second semiconductor relay 200 to operate independently and be inspected independently.

Furthermore, since a terminal for inspection such as that disclosed in PTL 2 is not provided between the output terminal and the output terminal, the insulation distance between first output terminal 410 and second output terminal 420 can be secured, and the withstand voltage between first output terminal 410 and second output terminal 420 can be increased.

Furthermore, first to fourth MOSFETs 161, 162, 261, 262 connected in series are located between first output terminal 410 and second output terminal 420, and MOSFET 161 provided in first semiconductor relay 100 and MOSFET 261 provided in second semiconductor relay 200 are arranged so that the sources and the drains thereof are aligned in the same direction. Moreover, MOSFET 162 provided in first semiconductor relay 100 and MOSFET 262 provided in second semiconductor relay 200 are arranged so that the sources and the drains thereof are aligned in the same direction.

This makes it possible to increase the withstand voltage between the output terminals.

<Variation 4>

Figure 12:
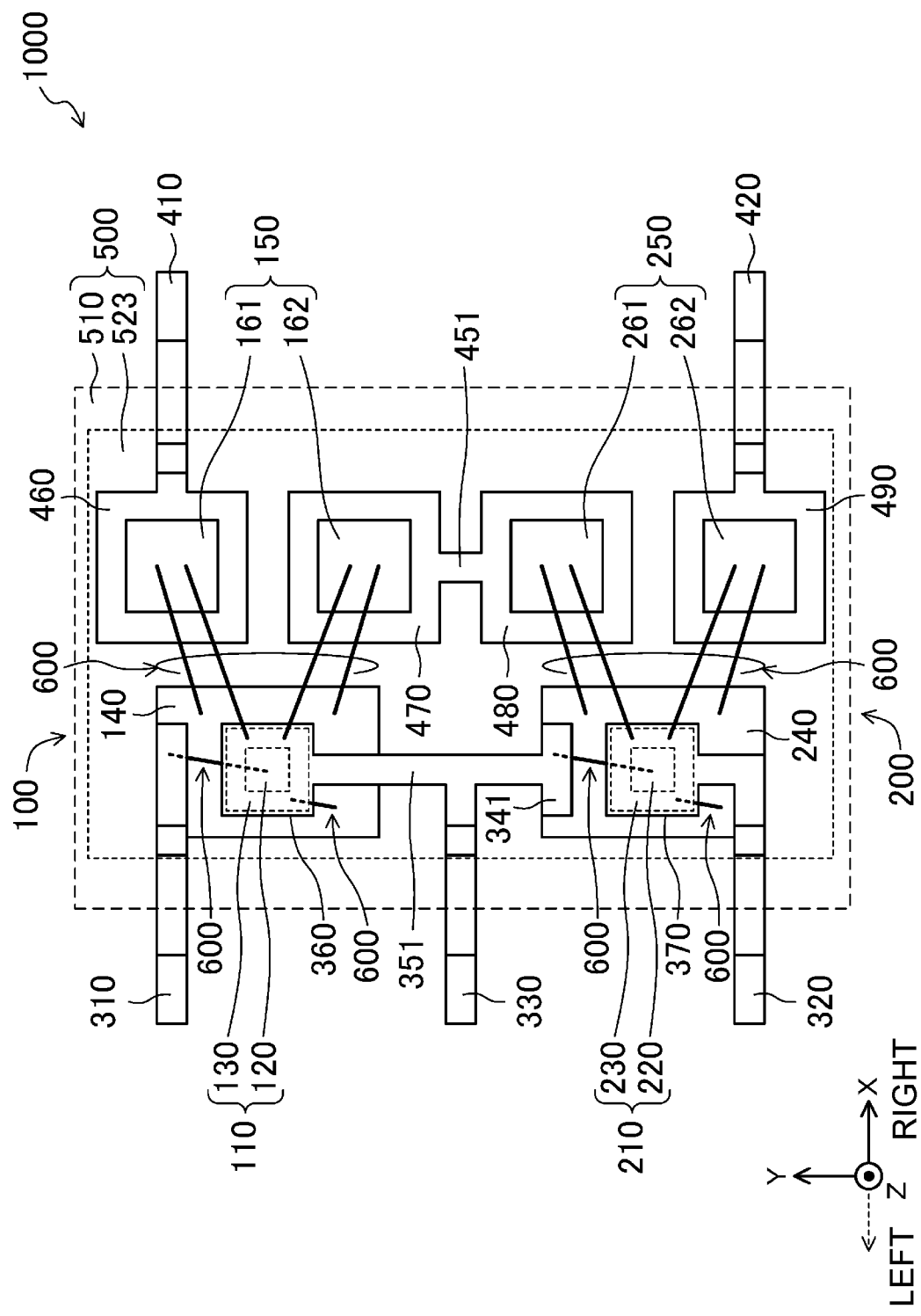
FIG. 12 is a plan view of a semiconductor relay module according to Variation 4.

FIG. 12 illustrates a plan view of a semiconductor relay module according to Variation 4.

The configuration according to the present variation illustrated in FIG. 12 is different from the configuration according to Embodiment 2 illustrated in FIG. 11 in that one light transmissive part 523 is provided across first semiconductor relay 100 and second semiconductor relay 200. Light transmissive part 523 is provided so as to cover first optocoupler 110, second optocoupler 210, first switch 150, and second switch 250.

Furthermore, the configuration is different from the configuration according to Embodiment 2 illustrated in FIG. 11 in that each of input connecting line 351 and output connecting line 451 extends in the Y direction and is provided inside light transmissive part 523. Note that third input terminal 330 is connected to internal terminal 341 via input connecting line 351 inside housing 500. Metal wire 600 having one end connected to the anode of second LED 220 is connected to internal terminal 341 at the other end.

In the present variation, it is also possible to produce advantageous effects that are substantially the same as those produced by the configuration described in Embodiment 2. Specifically, it is possible to operate each of first semiconductor relay 100 and second semiconductor relay 200 independently and furthermore inspect each of first semiconductor relay 100 and second semiconductor relay 200 independently. Moreover, the withstand voltage between first output terminal 410 and second output terminal 420 can be increased.

Note that as described in the present variation, light transmissive part 523 may be provided across first semiconductor relay 100 and second semiconductor relay 200. However, with light blocker 510 provided between first light transmissive part 521 and second light transmissive part 522 as described in Embodiment 1, when one of first semiconductor relay 100 and second semiconductor relay 200 operates independently, the occurrence of erroneous operation of the other semiconductor relay can be reduced and, by extension, the accuracy of inspection in which each of first semiconductor relay 100 and second semiconductor relay 200 is inspected independently can be ensured.

<Variation 5>

Figure 13:
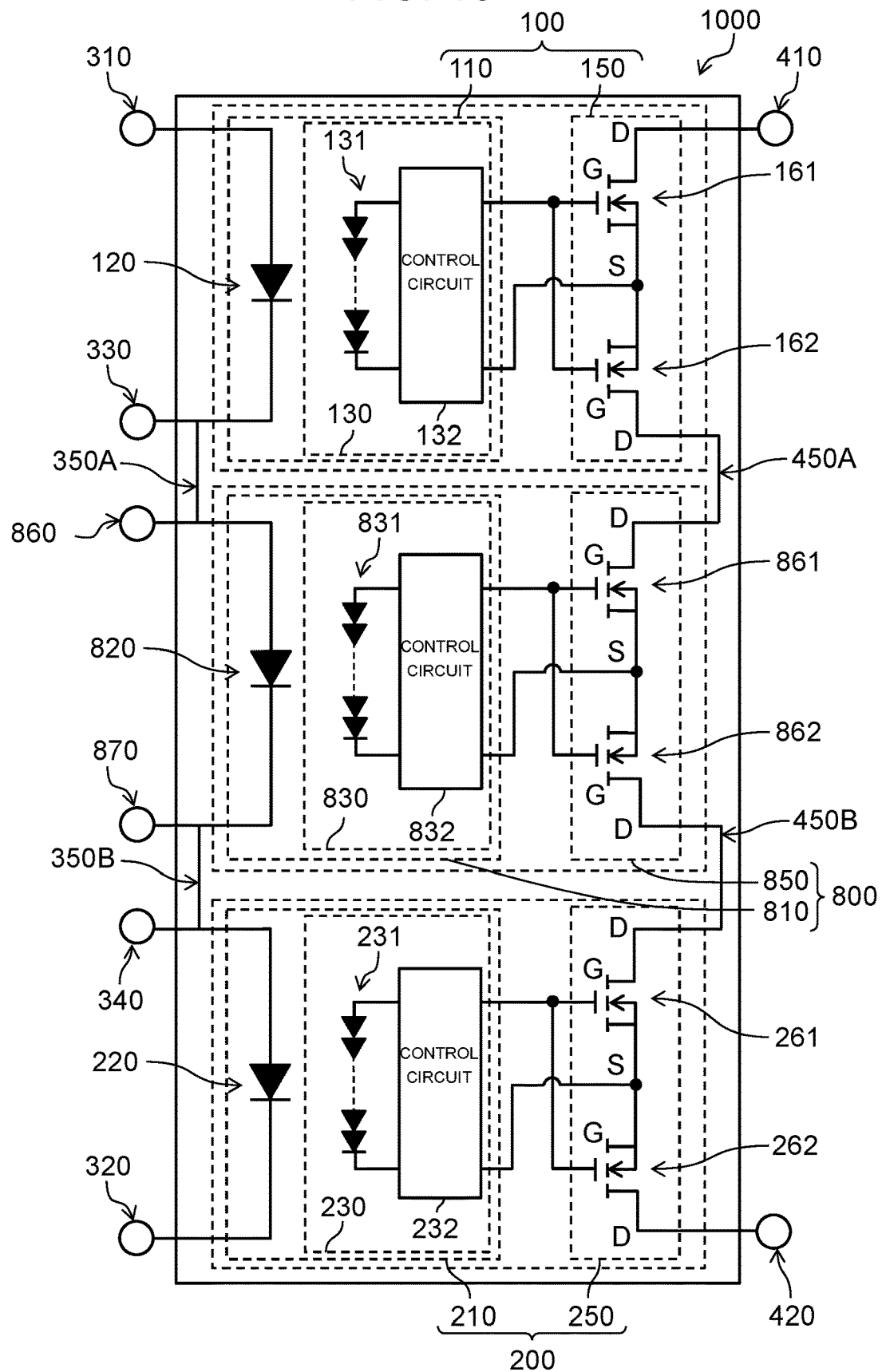
FIG. 13 is a circuit diagram of a semiconductor relay module according to Variation 5.

FIG. 13 illustrates a circuit diagram of semiconductor relay module 1000 according to Variation 5. Note that elements that are substantially the same as those according to the above-described exemplary embodiments are assigned the same reference marks and as such, detailed description thereof will be omitted.

In the above-described exemplary embodiments, two semiconductor relays (first semiconductor relay 100 and second semiconductor relay 200) are provided, but the semiconductor relay module according to Variation 5 includes three semiconductor relays (first semiconductor relay 100, third semiconductor relay 800, and second semiconductor relay 200). First semiconductor relay 100, third semiconductor relay 800, and second semiconductor relay 200 are sequentially arranged side-by-side in one direction.

In the above-described exemplary embodiments, one input connecting line 350 is provided. In contrast, in Variation 5, third semiconductor relay 800 is further provided, and thus two input connecting lines 350A, 350B are provided, as illustrated in FIG. 13.

This same is true for output connecting line 450; in the above-described exemplary embodiments, one output connecting line 450 is provided, but in Variation 5, two output connecting lines 450A, 450B are provided, as illustrated in FIG. 13.

Similar to first semiconductor relay 100 and second semiconductor relay 200, third semiconductor relay 800 is connected to two input terminals (input terminal 860 and input terminal 870).

Similar to first semiconductor relay 100 and second semiconductor relay 200, third semiconductor relay 800 includes: third optocoupler 810 including third LED 820 and third light-receiving device 830 which receives the optical signal from third LED 820; third switch 850 including MOSFET 861 and MOSFET 862; and third control circuit 832. Third light-receiving device 830 includes third PDA (third light-receiving element) 831. MOSFET 861 and MOSFET 862 connect and disconnect between the first output end and the second output end, which are provided on MOSFET 861 and MOSFET 862, respectively, according to the output signal from third light-receiving device 830.

Note that although the three semiconductor relays are provided in Variation 5, two or more semiconductor relays may be provided between first semiconductor relay 100 and second semiconductor relay 200. In other words, the number of semiconductor relays is not limited to two or three and may be four or more. It is necessary to change the number of input connecting lines 350 and the number of output connecting lines 450, as appropriate, according to the number of semiconductor relays.

Other Exemplary Embodiments

A new exemplary embodiment may be configured by combining, as appropriate, the structural elements described in Embodiments 1, 2 and Variations 1 to 5. For example, in the configuration according to Embodiment 2 illustrated in FIG. 11, intermediate terminal 440 connected to output connecting line 451 and exposed from housing 500 may be provided as described in Variation 3.

Note that metal wire 600 described in the specification of the present application is a gold wire, but a wire made of a different material may be used as needed. For example, an aluminum wire, a copper wire, or the like can also be used.

INDUSTRIAL APPLICABILITY

In a semiconductor relay module according to the present disclosure, each of a plurality of semiconductor relays included therein can be inspected independently, and the withstand voltage between output terminals can be increased; thus, the semiconductor relay module according to the present disclosure is useful.

REFERENCE MARKS IN THE DRAWINGS 100 first semiconductor relay
110 first optocoupler
120 first LED (first light-emitting element)
130 first light-receiving device
131 first PDA (first light-receiving element)
132 first control circuit
140 die pad
150 first switch 161 MOSFET
162 MOSFET
200 second semiconductor relay
210 second optocoupler
220 second LED (second light-emitting element)
230 second light-receiving device
231 second PDA (second light-receiving element)
232 second control circuit
240 die pad
250 second switch
261 MOSFET
262 MOSFET
310 first input terminal
320 second input terminal
330 third input terminal
340 fourth input terminal
341 internal terminal
350, 350A, 350B input connecting line
360, 370 die pad
410 first output terminal
420 second output terminal
430 intermediate terminal
440 intermediate terminal
450, 450A, 450B output connecting line
450a first portion
451 output connecting line
452 output connecting line
460, 470, 480, 490 die pad
500 housing
510 light blocker
521 first light transmissive part
522 second light transmissive part
523 light transmissive part
600 metal wire
700 lead frame
710 primary tie bar
800 third semiconductor relay
810 third optocoupler
820 third LED (third light-emitting element)
830 third light-receiving device
831 third PDA (third light-receiving element)
832 third control circuit
850 third switch
860, 870 input terminal
861 MOSFET
862 MOSFET
1000, 1100, 1200 semiconductor relay module
2100, 2200 power supply

The invention claimed is:

1. A semiconductor relay module comprising:
a first semiconductor relay;
a second semiconductor relay;
a housing covering the first semiconductor relay and the second semiconductor relay;
a first input terminal exposed from the housing;
a second input terminal exposed from the housing;
a first output terminal exposed from the housing;
a second output terminal exposed from the housing;
a third input terminal exposed from the housing;
an input connecting line covered by the housing; and
an output connecting line covered by the housing, wherein
the first semiconductor relay includes:
a first optocoupler including a first light-emitting element and a first light-receiving device configured to receive an optical signal from the first light-emitting element; and
a first switch including a first metal oxide semiconductor field effect transistor (MOSFET) configured to connect and disconnect between a first output end of the first semiconductor relay and a second output end of the first semiconductor relay according to an output signal from the first light-receiving device, a gate of the first MOSFET being coupled to the first optocoupler,
the second semiconductor relay includes:
a second optocoupler including a second light-emitting element and a second light-receiving device configured to receive an optical signal from the second light-emitting element; and
a second switch including a second MOSFET configured to connect and disconnect between a first output end of the second semiconductor relay and a second output end of the second semiconductor relay according to an output signal from the second light-receiving device, a gate of the second MOSFET being coupled to the second optocoupler,
the first input terminal is connected to an anode of the first light-emitting element,
the second input terminal is connected to a cathode of the second light-emitting element,
a cathode of the first light-emitting element of the first semiconductor relay and an anode of the second light-emitting element of the second semiconductor relay are connected via the input connecting line,
the first output terminal is connected to the first output end of the first semiconductor relay,
the second output terminal is connected to the second output end of the second semiconductor relay,
the second output end of the first semiconductor relay and the first output end of the second semiconductor relay are connected via the output connecting line, and
the third input terminal is connected to the input connecting line.

2. The semiconductor relay module according to claim 1, further comprising:
a light blocker configured to block the optical signal that is output from the first light-emitting element and the optical signal that is output from the second light-emitting element, wherein
the light blocker is formed of a light-blocking resin, and
the light blocker is disposed between the first optocoupler of the first semiconductor relay and the second optocoupler of the second semiconductor relay.

3. The semiconductor relay module according to claim 1, wherein
the output connecting line is completely covered by the housing.

4. The semiconductor relay module according to claim 1, wherein
the first semiconductor relay and the second semiconductor relay are arranged side-by-side, and
the output connecting line is disposed adjacent to the first semiconductor relay and the second semiconductor relay in a manner to provide a distance from a first light transmissive part provided in the first optocoupler and a distance from a second light transmissive part provided in the second optocoupler.

5. The semiconductor relay module according to claim 4, wherein
the first semiconductor relay and the second semiconductor relay are disposed between the input connecting line and the output connecting line.

6. The semiconductor relay module according to claim 4, wherein
the first light transmissive part and the second light transmissive part are integrally formed.

7. The semiconductor relay module according to claim 1, wherein
the first semiconductor relay and the second semiconductor relay are arranged side-by-side, and
the input connecting line is disposed adjacent to the first semiconductor relay and the second semiconductor relay in a manner to provide a distance from a first light transmissive part provided in the first optocoupler and a distance from a second light transmissive part provided in the second optocoupler.

8. The semiconductor relay module according to claim 1, wherein
the first semiconductor relay further includes a third MOSFET,
the second semiconductor relay further includes a fourth MOSFET, and
at least one of the first MOSFET or the third MOSFET and at least one of the second MOSFET or the fourth MOSFET are arranged to align sources and drains thereof in a same direction.

9. The semiconductor relay module according to claim 8, wherein
the first MOSFET and the third MOSFET are electrically connected in series,
the source of the first MOSFET and the source of the third MOSFET are electrically connected to each other,
the second MOSFET and the fourth MOSFET are electrically connected in series, and
the source of the second MOSFET and the source of the fourth MOSFET are electrically connected to each other.

10. The semiconductor relay module according to claim 8, further comprising:
a first die pad on which the first MOSFET is mounted;
a second die pad on which the second MOSFET is mounted;
a third die pad on which the third MOSFET is mounted;
a fourth die pad on which the fourth MOSFET is mounted;
a fifth die pad on which the first light-receiving device is mounted; and
a sixth die pad on which the second light-receiving device is mounted, wherein
the first light-receiving device includes:
a first light-receiving element configured to receive the optical signal from the first light-emitting element; and
a first control circuit configured to drive the first MOSFET and the third MOSFET,
the second light-receiving device includes:
a second light-receiving element configured to receive the optical signal from the second light-emitting element; and
a second control circuit configured to drive the second MOSFET and the fourth MOSFET,
the gate of the first MOSFET and a gate of the third MOSFET are electrically connected to the first control circuit,
the drain of the first MOSFET is electrically connected to the first die pad,
the drain of the third MOSFET is electrically connected to the third die pad,
the source of the first MOSFET and the source of the third MOSFET are electrically connected to the fifth die pad,
the gate of the second MOSFET and a gate of the fourth MOSFET are electrically connected to the second control circuit,
the drain of the second MOSFET is electrically connected to the second die pad,
the drain of the fourth MOSFET is electrically connected to the fourth die pad, and
the source of the second MOSFET and the source of the fourth MOSFET are electrically connected to the sixth die pad.

11. The semiconductor relay module according to claim 1, further comprising:
a fourth input terminal exposed from the housing and connected to the input connecting line.

12. The semiconductor relay module according to claim 1, wherein no output terminal exposed from the housing is provided to the output connecting line.

13. A semiconductor relay module comprising:
a plurality of semiconductor relays arranged side-by-side in one direction;
a first input terminal exposed from a housing;
a second input terminal exposed from the housing;
a third input terminal exposed from the housing;
a first output terminal exposed from the housing;
a second output terminal exposed from the housing;
an input connecting line covered by the housing; and
an output connecting line covered by the housing, wherein
the plurality of semiconductor relays include a first semiconductor relay at one end, a second semiconductor relay at an other end, and a third semiconductor relay between the first semiconductor relay and the second semiconductor relay, the third semiconductor relay being adjacent to the first semiconductor,
the first semiconductor relay includes:
a first optocoupler including a first light-emitting element and a first light-receiving device configured to receive an optical signal from the first light-emitting element; and
a first switch including a first metal oxide semiconductor field effect transistor (MOSFET) configured to connect and disconnect between a first output end of the first semiconductor relay and a second output end of the first semiconductor relay according to an output signal from the first light-receiving device, a gate of the first MOSFET being coupled to the first optocoupler,
the second semiconductor relay includes:
a second optocoupler including a second light-emitting element and a second light-receiving device configured to receive an optical signal from the second light-emitting element; and
a second switch including a second MOSFET configured to connect and disconnect between a first output end of the second semiconductor relay and a second output end of the second semiconductor relay according to an output signal from the second light-receiving device, a gate of the second MOSFET being coupled to the second optocoupler,
the third semiconductor relay includes:
a third optocoupler including a third light-emitting element and a third light-receiving device configured to receive an optical signal from the third light-emitting element; and a third switch including a third MOSFET configured to connect and disconnect between a first output end of the third semiconductor relay and a second output end of the third semiconductor relay according to an output signal from the third light-receiving device, a gate of the third MOSFET being coupled to the third optocoupler, the first input terminal is connected to an anode of the first light-emitting element, the second input terminal is connected to a cathode of the second light-emitting element, a cathode of the first light-emitting element of the first semiconductor relay and an anode of the third light-emitting element of the third semiconductor relay are connected via the input connecting line, the first output terminal is connected to the first output end of the first semiconductor relay, the second output terminal is connected to the second output end of the second semiconductor relay, the second output end of the first semiconductor relay and the first output end of the third semiconductor relay are connected via the output connecting line, and the third input terminal is connected to the input connecting line.

* * * * *